(12) United States Patent
Tuan et al.

(10) Patent No.: US 9,586,382 B2
(45) Date of Patent: Mar. 7, 2017

(54) CERAMIC/METAL COMPOSITE STRUCTURE

(75) Inventors: Wei-Hsing Tuan, Taipei (TW); Shao-Kuan Lee, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 1420 days.

(21) Appl. No.: 13/354,176

(22) Filed: Jan. 19, 2012

(65) Prior Publication Data

US 2012/0114966 A1 May 10, 2012

Related U.S. Application Data

(63) Continuation-in-part of application No. 12/010,379, filed on Jan. 24, 2008, now Pat. No. 8,127,441.

(51) Int. Cl.
*B32B 15/20* (2006.01)
*H01L 23/373* (2006.01)
(Continued)

(52) U.S. Cl.
CPC .............. *B32B 15/20* (2013.01); *B32B 18/00* (2013.01); *C04B 37/026* (2013.01); *H01L 23/3735* (2013.01); *H05K 3/388* (2013.01); *B32B 2311/00* (2013.01); *B32B 2315/02* (2013.01); *B32B 2457/00* (2013.01); *C04B 2235/6584* (2013.01); *C04B 2235/9607* (2013.01); *C04B 2237/062* (2013.01); *C04B 2237/12* (2013.01); *C04B 2237/122* (2013.01); *C04B 2237/123* (2013.01); *C04B 2237/125* (2013.01); *C04B 2237/34* (2013.01); *C04B 2237/341* (2013.01);
(Continued)

(58) Field of Classification Search
None
See application file for complete search history.

(56) References Cited

U.S. PATENT DOCUMENTS 3,934,074 A * 1/1976 Evelove ............... H05K 1/0271
174/535
3,993,411 A 11/1976 Babcock et al.
(Continued)

FOREIGN PATENT DOCUMENTS

| CN | 1364748 | 8/2002 |
|---|---|---|
| CN | 1653016 A | 8/2005 |

(Continued)

OTHER PUBLICATIONS

Yoshino, Yuichi, "Role of Oxygen in Bonding Copper to Alumina", J. Am. Ceram. Soc., (1989), pp. 1322-1327, vol. 72, (8).
(Continued)

*Primary Examiner* — Daniel J Schleis
(74) *Attorney, Agent, or Firm* — Muncy, Geissler, Olds & Lowe, P.C.

(57) ABSTRACT

A ceramic/metal composite structure includes an aluminum oxide substrate, an interface bonding layer and a copper sheet. The interface bonding layer is disposed on the aluminum oxide substrate. The copper sheet is disposed on the interface bonding layer. The interface bonding layer bonds the aluminum oxide substrate to the copper sheet. Some pores are formed near or in the interface bonding layer. A porosity of the interface bonding layer is substantially smaller than or equal to 25%.

14 Claims, 27 Drawing Sheets

(51) Int. Cl.

| | | |
|---|---|---|
| *H05K 3/38* | (2006.01) | |
| *B32B 18/00* | (2006.01) | |
| *C04B 37/02* | (2006.01) | |
| *H05K 1/03* | (2006.01) | |
| *H05K 3/18* | (2006.01) | |

(52) U.S. Cl.
CPC .. *C04B 2237/343* (2013.01); *C04B 2237/366* (2013.01); *C04B 2237/368* (2013.01); *C04B 2237/407* (2013.01); *C04B 2237/54* (2013.01); *C04B 2237/56* (2013.01); *C04B 2237/58* (2013.01); *C04B 2237/597* (2013.01); *C04B 2237/60* (2013.01); *C04B 2237/704* (2013.01); *C04B 2237/706* (2013.01); *C04B 2237/708* (2013.01); *C04B 2237/72* (2013.01); *H01L 2224/48091* (2013.01); *H01L 2924/09701* (2013.01); *H05K 1/0306* (2013.01); *H05K 3/181* (2013.01); *H05K 2201/0355* (2013.01); *H05K 2201/068* (2013.01); *H05K 2203/072* (2013.01); *Y10T 428/12479* (2015.01); *Y10T 428/249984* (2015.04)

(56) References Cited

U.S. PATENT DOCUMENTS

| | | | |
|---|---|---|---|
| 4,713,494 A * | 12/1987 | Oikawa | H05K 3/4061 |
| | | | 174/257 |
| 5,224,265 A | 7/1993 | Dux et al. | |
| 5,561,321 A * | 10/1996 | Hirano | B32B 15/01 |
| | | | 257/700 |
| 5,703,341 A * | 12/1997 | Lowndes | B23K 26/34 |
| | | | 219/121.66 |
| 6,197,435 B1 | 3/2001 | Tsujimura et al. | |
| 6,613,450 B2 | 9/2003 | Tsukaguchi et al. | |
| 6,918,529 B2 | 7/2005 | Tsukaguchi et al. | |
| 2003/0213616 A1 | 11/2003 | Kusukawa et al. | |
| 2006/0201201 A1 | 9/2006 | Fushie et al. | |
| 2008/0291633 A1 | 11/2008 | Tuan | |

FOREIGN PATENT DOCUMENTS

| | | |
|---|---|---|
| CN | 201149866 Y | 11/2008 |
| TW | I236736 | 7/2005 |
| TW | I247567 | 1/2006 |
| TW | I258324 | 7/2006 |
| TW | 200627596 | 8/2006 |

OTHER PUBLICATIONS

Beraud et al., "Study of Copper-Alumina Bonding", Journal of Materials Science, (1989), pp. 4545-4554, vol. 24.

Seager, et al., "The Influence of $CuAlO_2$ on the Strength of Eutectically Bonded $Cu/Al_2O_3$ Interfaces", Scripta Materialia, (2002), pp. 395-400, vol. 46.

* cited by examiner

CERAMIC/METAL COMPOSITE STRUCTURE

This application is a Continuation-in-Part of application Ser. No. 12/010,379, filed on Jan. 24, 2008 which issued as U.S. Pat. No. 8,127,441 B2 on Mar. 6, 2012.

BACKGROUND OF THE INVENTION

Field of Invention

The present invention relates to a ceramic/metal composite structure and a method of manufacturing the same, and more particularly to a composite structure composed of an aluminum oxide layer and a copper layer, and a method of manufacturing the same.

Related Art

Heat is generated when an electronic component is operating with electrons flowing therethrough. The generation of heat increases the resistance and blocks the flows of the electrons so that the function of the electronic component is significantly influenced. When the technology of manufacturing the electronic component is greatly enhanced, a line width in the electronic component is getting smaller and smaller, and the line density in the electronic component is getting higher and higher. Thus, the heat generated by the electronic component is increased rapidly. Taking a central processing unit (CPU) of a computer as an example, the Pentium CPU only has to be equipped with the package with the heat dissipating capability of 16 W at its early stage. However, the heat generating power in the CPU produced in the year of 2004 has reached 84 W, and the heat generated in the CPU in the year of 2006 has reached 98 W. If the heat cannot be removed rapidly, the temperature of the CPU of the computer is rapidly increased so that the CPU of the computer can no longer operate. Thus, the heat dissipating ability of the substrate contacting with the CPU of the computer is a key factor for dominating whether the computer can operate normally or not.

A typical power component, such as a solid relay, is similar to the CPU of the computer and generates a lot of heat. Thus, the power component needs to dissipate the heat rapidly through the substrate contacting therewith so that it can operate normally.

Taking a light-emitting diode (LED) as another example, various color LEDs have been gradually developed, wherein the successful development of the white-light LED has attracted considerable attention. This is because the white-light LED can serve as a light source for an illumination lamp. The power consumption of a road lamp with LED light source is lower than that of a mercury lamp by 75% and is lower than that of a high pressure sodium lamp by 49%. So, the white-light LED advantageously has the low power consumption and can significantly save the energy. However, the white-light LED with the output power higher than 3 W has to be adopted in the application of the lamp used in the daily life and the applications such as the head light used in a vehicle. This white-light LED with the high output power also generates a lot of heat. However, the major barrier on the application of LED as the light source is that the LED cannot withstand the high temperature. Generally speaking, the temperature of the LED cannot exceed 90° C. If the temperature of the LED is higher than 90° C., the luminance thereof rapidly deteriorates. So, the rapid heat dissipating ability of the heat dissipation substrate in contact with the LED has become a greatest challenge for determining whether the LED can become the illumination light source or not. This also specifies that the development of the heat dissipating substrate has played an important role on the applications of the LED as the light source.

In order to satisfy the miniaturized requirement of the current 3C electronic product, the substrate contacting with the CPU of the computer, or the power component or the LED has to satisfy the following fundamental requirements.

First, the material must have a high thermal conductivity to dissipate the heat rapidly.

Second, the material must have the high resistivity in order to prevent the high power electronic component from being short-circuited.

Third, the substrate preferably has to be as thin as possible after the above-mentioned conditions are satisfied.

Fourth, the substrate has to be used with the good reliability for a long time. This is because the high power electronic component, after being packaged, will encounter several tens of thousand times of on-off cycles, and the temperature of the substrate contacting with the high power electronic component is instantaneously increased and decreased therewith for several tens of thousand times. So, the reliability after the electronic component has been used for a long time is an extremely important requirement. This is absolutely associated with the bonding strength between the ceramic material and the metal material.

At present, the heat dissipating mechanisms of the electronic components, which are frequently used, include heat dissipating fins and a heat pipe accompanied with fans in order to dissipate the heat generated by the high power electronic components. However, such heat dissipating structure has a larger thickness, and the applications in designing a miniaturized 3C electronic product are thus hindered.

In order to satisfy the requirements on heat dissipating and to keep the size small and the price low, many materials have been evaluated. Taking the copper as an example, the copper has a high thermal conductivity, which can reach 380 W/mK. There are many choices, which can satisfy the second requirement of insulation, because most polymeric organic materials or ceramic materials can satisfy this requirement. In order to satisfy the requirement of heat dissipating, the ceramic material is the better choice under the consideration of the long-term reliability. Among the ceramic materials, aluminum oxide and aluminum nitride can provide the high thermal conductivity and the high insulating resistance. The thermal conductivity of aluminum oxide can reach 20 to 38 W/mK, while the thermal conductivity of aluminum nitride can reach 40 to 200 W/mK. The thermal conductivity of the ceramic material has a wider range because the thermal conductivity of the ceramic material is significantly influenced by the purity of the ceramic material and the type of the sintering additive used. Furthermore, the resistivity of aluminum oxide and aluminum nitride can be equal to or greater than $10^{10}$ Ωm. Thus, the two ceramic materials exhibit the excellent insulating properties. Furthermore, aluminum oxide and aluminum nitride posses the low dielectric constant and the high dielectric strength, and are thus frequently used as the material for a substrate.

However, the aluminum oxide is a solid, which has a high melting point (higher than 2000° C.) and has coexisted covalent bonds and ionic bonds. The copper atoms are combined with metallic bonds, and the copper has the melting point, which is only 1083° C. So, it is a great challenge to bond the aluminum oxide and the copper together. According to the report of Beraud, C., Courbiere, M., Esnouf, C., Juve, D., Treheux, D., J. Mater. Sci., 24, 4545, 1989, there are two conventional methods for bonding the aluminum oxide with the copper. The first method is the solid state bonding method, and the second method is the liquid phase bonding method, as disclosed in U.S. Pat. No. 3,993,411. The treating temperatures of these two methods are higher than 1000° C.

According to the research made by Seager et. al., (Seager, C. W., Kokini, K., Trumble, K., Krane, M. J. M., Scripta Materialia, 46, 395, 2002), the thick copper oxide is disadvantageous to the bonding between aluminum oxide and copper. After a long-term investigation, it is found out that the substrate, formed by bonding an aluminum oxide sheet and a copper sheet together, cannot have the application value until the interface strength between the aluminum oxide sheet and the copper sheet reaches a very high level. This is because the aluminum oxide and the copper have different bonds, and the coefficient of thermal expansion of the copper ($17 \times 10^{-6} K^{-1}$) is two times of the coefficient of thermal expansion of the aluminum oxide ($8 \times 10^{-6} K^{-1}$). A formula derived by Seising (Selsing, J., J. Am. Ceram. Soc., 44, 419, 1961) is listed in the following:

$$\sigma = \frac{\Delta\alpha \cdot \Delta T}{\frac{1+v_{Al2O3}}{2E_{Al2O3}} + \frac{1-2v_{Cu}}{2E_{Cu}}}$$

In the above-mentioned formula, $\Delta\alpha$ denotes a difference between coefficients of thermal expansion of the aluminum oxide and the copper, $\Delta T$ denotes a difference between the room temperature and the manufacturing temperature, $v$ denotes the Poisson's ratio and E denotes the elastic constant. The temperature, at which the aluminum oxide sheet and the copper sheet are joined together is over 1000° C., so the estimated thermal stress induced by the thermal expansion mismatch between aluminum oxide and copper after the high temperature joining process can reach several hundreds of MPa. This thermal stress is very large and significantly influences the bonding strength between the aluminum oxide sheet and the copper sheet. In addition, after the aluminum oxide sheet and the copper sheet are joined together, the composite substrate is packaged together with electronic components. Since the electronic component may be turned on and off for several tens of thousand times, de-bonding may be formed at the interface between the aluminum oxide sheet and the copper sheet if the bonding strength between the aluminum oxide sheet and the copper sheet is not high enough. Thus, the heat spreading ability is greatly reduced, which significantly influences the reliability after the high power electronic component is used for a long time.

Thus, it is an important subject of the present invention to provide a ceramic/metal composite structure having a high bonding strength.

SUMMARY OF THE INVENTION

It is therefore an object of the present invention to provide a ceramic/metal composite structure and a method of manufacturing the same in order to provide strong bonds between the ceramic and metal materials, and thus to provide the good heat dissipating and insulating properties for an electronic component under the considerations of the thinner dimension and the long-term reliability.

The present invention achieves the above-identified objective by providing a ceramic/metal composite structure, which includes a ceramic substrate, a metal interface layer disposed on the ceramic substrate, and a copper sheet disposed on the metal interface layer.

The present invention also provides a method of manufacturing a ceramic/metal composite structure. The method includes the following steps: providing a ceramic substrate; forming a metal interface layer on the ceramic substrate; placing a copper sheet on the metal interface layer; and heating the ceramic substrate, the metal interface layer and the copper sheet so that the metal interface layer forms strong bonds with the ceramic substrate and the copper sheet. Multiple stages of pre-oxidizing processes are performed on the copper sheet at different temperatures and in different atmospheres with different oxygen partial pressures before the copper sheet is placed on the metal interface layer. The metal interface layer provides a wetting effect for the copper sheet to the ceramic substrate at a high temperature so that the copper sheet wets a surface of the aluminum oxide.

The present invention further provides a ceramic/metal composite structure including a lower metal layer, a lower metal interface layer disposed on the lower metal layer, a ceramic substrate disposed on the lower metal interface layer, an upper metal interface layer disposed on the ceramic substrate, and an upper metal layer disposed on the upper metal interface layer.

The present invention further provides a ceramic/metal composite structure including an aluminum oxide substrate, an interface bonding layer and a copper sheet. The interface bonding layer is disposed on the aluminum oxide substrate. The copper sheet is disposed on the interface bonding layer. The interface bonding layer bonds the aluminum oxide substrate to the copper sheet and has a plurality of pores. A porosity of the interface bonding layer is substantially smaller than or equal to 25%.

The present invention further provides a method of manufacturing a ceramic/metal composite structure. The method includes the steps of: providing an aluminum oxide substrate; forming a nickel alloy interface layer on the aluminum oxide substrate, wherein a thickness of the nickel alloy interface layer is smaller than or equal to 1000 nanometers; placing a copper sheet on the nickel alloy interface layer; and heating the aluminum oxide substrate, the nickel alloy interface layer and the copper sheet so that the nickel alloy interface layer forms strong bonds with the aluminum oxide substrate and the copper sheet. The nickel alloy interface layer reacts with the copper sheet to form an interface bonding layer having a plurality of pores. A porosity of the interface bonding layer is substantially smaller than or equal to 25%.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE INVENTION

The present invention will be apparent from the following detailed description, which proceeds with reference to the accompanying drawings, wherein the same references relate to the same components.

Figure 1:
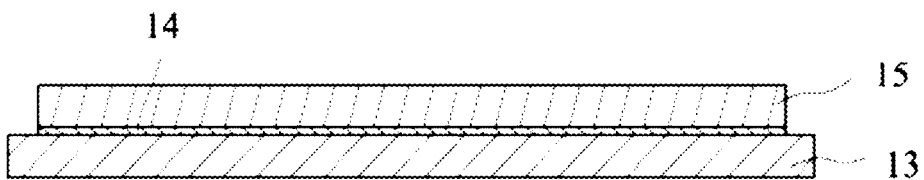
FIG. 1 is a schematically cross-sectional view showing a ceramic/metal composite structure according to a first embodiment of the present invention.

FIG. 1 is a schematically cross-sectional view showing a ceramic/metal composite structure according to a first embodiment of the present invention. Referring to FIG. 1, the ceramic/metal composite structure of this embodiment includes a ceramic substrate 13, a metal interface layer 14 and a copper sheet 15.

In this embodiment, the ceramic substrate 13 is composed of aluminum oxide or aluminum nitride. However, the present invention is not limited thereto. According to the following description, the ceramic substrate 13 may also be made of other materials.

The metal interface layer 14 is disposed on the ceramic substrate 13. The material of the metal interface layer 14 is selected from the group consisting of gold, beryllium, bismuth, cobalt, copper, iron, nickel, palladium, platinum, titanium, yttrium and alloys thereof. Alternatively, the material of the metal interface layer 14 is selected from the group consisting of nickel, a nickel alloy, copper and a copper alloy. The thickness of the metal interface layer 14 ranges from 0.05 microns to 10 microns, and preferably ranges from 0.05 micron to 3 microns.

The copper sheet 15 is disposed on the metal interface layer 14. The copper sheet 15 has one pattern or electric connection point (not shown) or multiple patterns or electric connection points (not shown). The metal interface layer 14 provides a wetting effect for the copper sheet 15 to the ceramic substrate 13 at a high temperature. In order to form the strong bonds, a coefficient of thermal expansion of the metal interface layer 14 ranges between coefficients of thermal expansion of the ceramic substrate 13 and the copper sheet 15. Alternatively, the coefficient of thermal expansion of the metal interface layer 14 is greater than or equal to that of the ceramic substrate 13, or is smaller than or equal to that of the copper sheet 15. For example, the coefficient of thermal expansion of the metal interface layer 14 ranges from $8 \times 10^{-6} K^{-1}$ to $17 \times 10^{-6} K^{-1}$.

Figure 2:
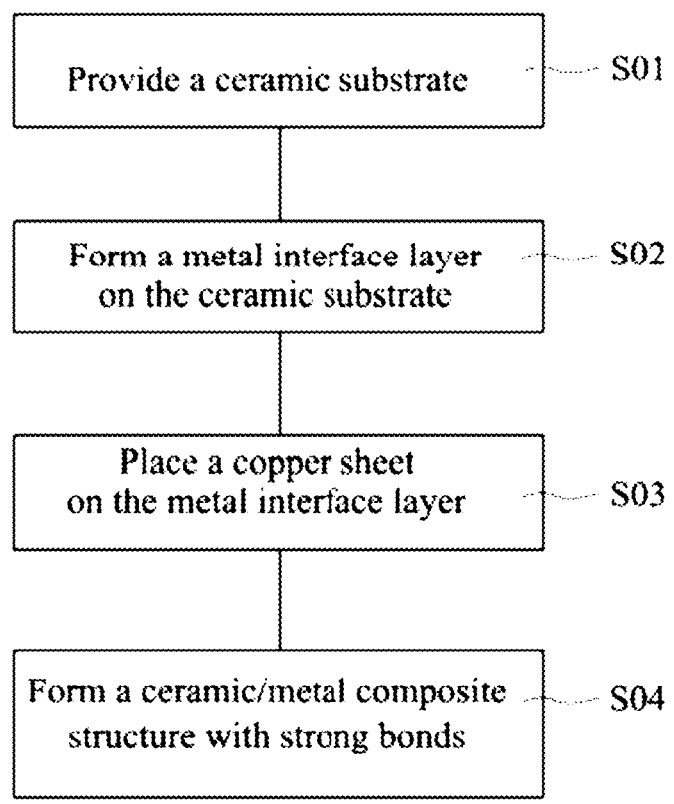
FIG. 2 is a flow chart showing a method of manufacturing the ceramic/metal composite structure according to the first embodiment of the present invention.

FIG. 2 is a flow chart showing a method of manufacturing the ceramic/metal composite structure according to the first embodiment of the present invention. As shown in FIGS. 1 and 2, the method of manufacturing the ceramic/metal composite structure of this embodiment includes the following steps.

First, in step S01, a ceramic substrate 13 is provided.

Then, in step S02, a metal interface layer 14 is formed on the ceramic substrate 13 by way of, for example, electroless plating, vapor deposition, coating, or the like.

Next, in step S03, a copper sheet 15 is placed on the metal interface layer 14. It is to be noted that multiple stages of pre-oxidizing processes are performed on the copper sheet 15 at a temperature ranging from 50 to 700° C. before the copper sheet 15 is placed on the metal interface layer 14.

Then, in step S04, the ceramic substrate 13, the metal interface layer 14 and the copper sheet 15 are heated to the temperature higher than 1000° C., for example, so that the metal interface layer 14 is simultaneously joined to the ceramic substrate 13 and the copper sheet 15 to form strong bonds.

In order to enhance the interface strength and improve the reliability of the ceramic/metal composite structure, a multi-stage pre-oxidation process is developed so that oxide can be formed on a surface of the metal sheet. This oxide layer enables the metal sheet and the ceramic sheet to be successfully joined together at a temperature above the eutectic temperature and results in very strong bonds formed between the ceramic sheet and the metal sheet. Thus, the interface strength between the ceramic and metal sheets can be enhanced, and the reliability of the ceramic/metal composite structure after being used for many cycles of temperature rising and falling can be enhanced. In addition, the multi-stage pre-oxidation process has the low temperature and the economic advantages, and the ceramic/metal composite structure formed by using the copper treated with the multi-stage pre-oxidation has the excellent heat dissipating ability.

The ceramic/metal composite structure of the present invention can provide the rapid heat dissipating ability and the good insulation ability. In order to enhance the interface strength and the long-term reliability of the composite structure, the proper multi-stage pre-oxidation may be performed. Embodiments will be illustrated to prove that the multi-stage oxidation can be performed at a lower temperature (the ratio of the absolute temperature of the highest temperature of the multi-stage pre-oxidation to the absolute temperature of the melting point of copper is smaller than or equal to 0.75). Because the pre-oxidation temperature is lowered, the cost can be lowered, and a heat spreading substrate with the high interface strength can be manufactured. A substrate composed of ceramic and metal sheets joined together may be regarded as the extension of this invention.

Figure 3:
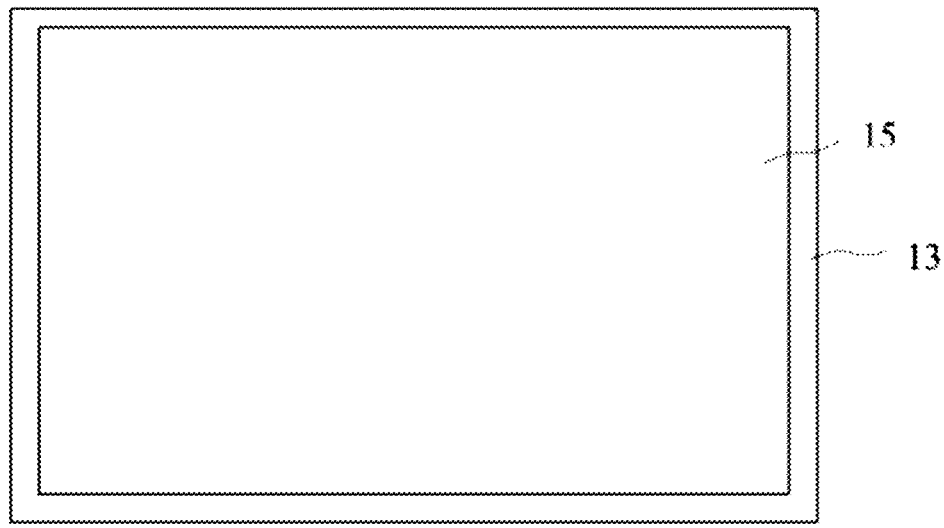
FIG. 3 is a schematic top view showing a ceramic/metal composite structure according to a second embodiment of the present invention.
Figure 4:
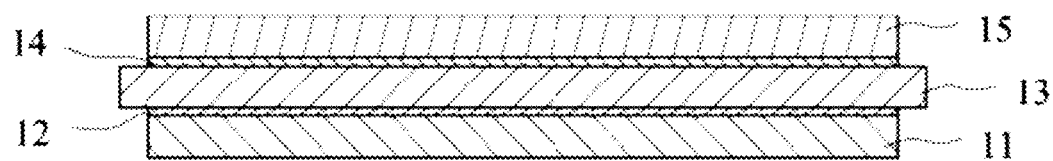
FIG. 4 is a schematically cross-sectional view showing the ceramic/metal composite structure according to the second embodiment of the present invention.

FIG. 3 is a schematic top view showing a ceramic/metal composite structure according to a second embodiment of the present invention. FIG. 4 is a schematically cross-sectional view showing the ceramic/metal composite structure according to the second embodiment of the present invention. Referring to FIGS. 3 and 4, the ceramic/metal composite structure of this embodiment includes a lower metal layer 11, a lower metal interface layer 12, a ceramic substrate 13, an upper metal interface layer 14 and an upper metal layer 15.

In this embodiment, the lower metal layer 11 is a copper sheet. The thickness of the lower metal layer 11 ranges from 0.1 to 2 mm. The lower metal interface layer 12 is disposed on the lower metal layer 11.

The ceramic substrate 13 is disposed on the lower metal interface layer 12. The thickness of the ceramic substrate 13 ranges from 0.1 to 3 mm. The material of the ceramic substrate 13 is selected from the group consisting of aluminum oxide, silicon oxide, aluminum nitride, silicon nitride, silicon carbide, glass and a glass-ceramic material.

The upper metal interface layer 14 is disposed on the ceramic substrate 13. The material of the metal interface layer 14 or 12 is selected from the group consisting of gold, beryllium, bismuth, cobalt, copper, iron, nickel, palladium, platinum, titanium, yttrium and alloys thereof. Alternatively, the material of the metal interface layer 14 or 12 is selected from the group consisting of nickel, a nickel alloy, copper and a copper alloy. The thickness of the metal interface layer 14 or 12 ranges from 0.05 to 10 microns, and preferably ranges from 0.05 micron to 3 microns.

The upper metal layer 15 is disposed on the upper metal interface layer 14. The upper metal layer 15 may be a copper sheet, on which various patterns or electric connection points are formed. The thickness of the upper metal layer 15 ranges from 0.1 to 2 mm.

Figure 5:
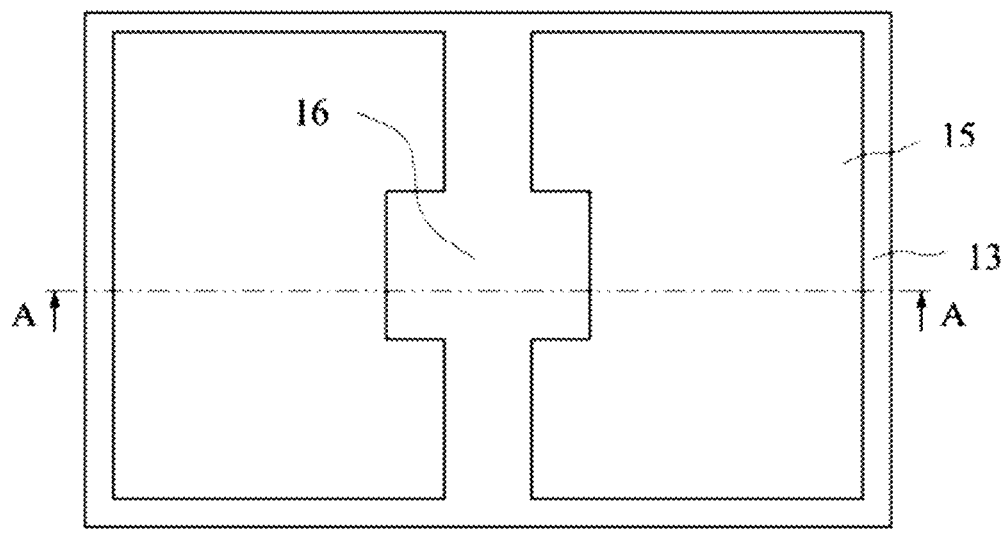
FIG. 5 is a schematic top view showing a ceramic/metal composite structure according to a third embodiment of the present invention.
Figure 6:
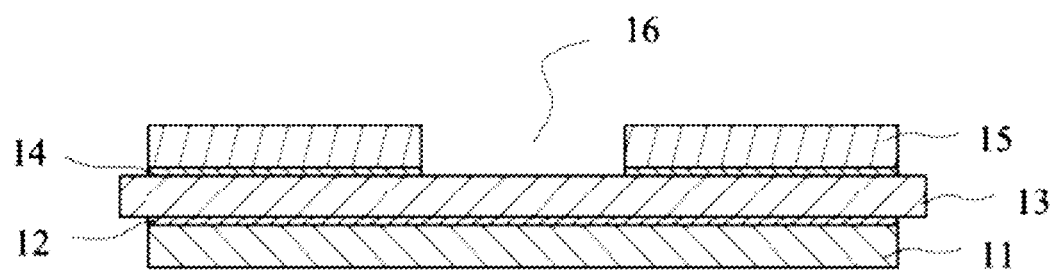
FIG. 6 is a schematically cross-sectional view taken along a line A-A of the ceramic/metal composite structure according to the third embodiment of the present invention.

FIG. 5 is a schematic top view showing a ceramic/metal composite structure according to a third embodiment of the present invention. FIG. 6 is a schematically cross-sectional view taken along a line A-A of the ceramic/metal composite structure according to the third embodiment of the present invention. As shown in FIGS. 5 and 6, this embodiment is similar to the second embodiment except that the upper metal layer 15 has a pattern, connection points, and an opening 16.

Figure 7:
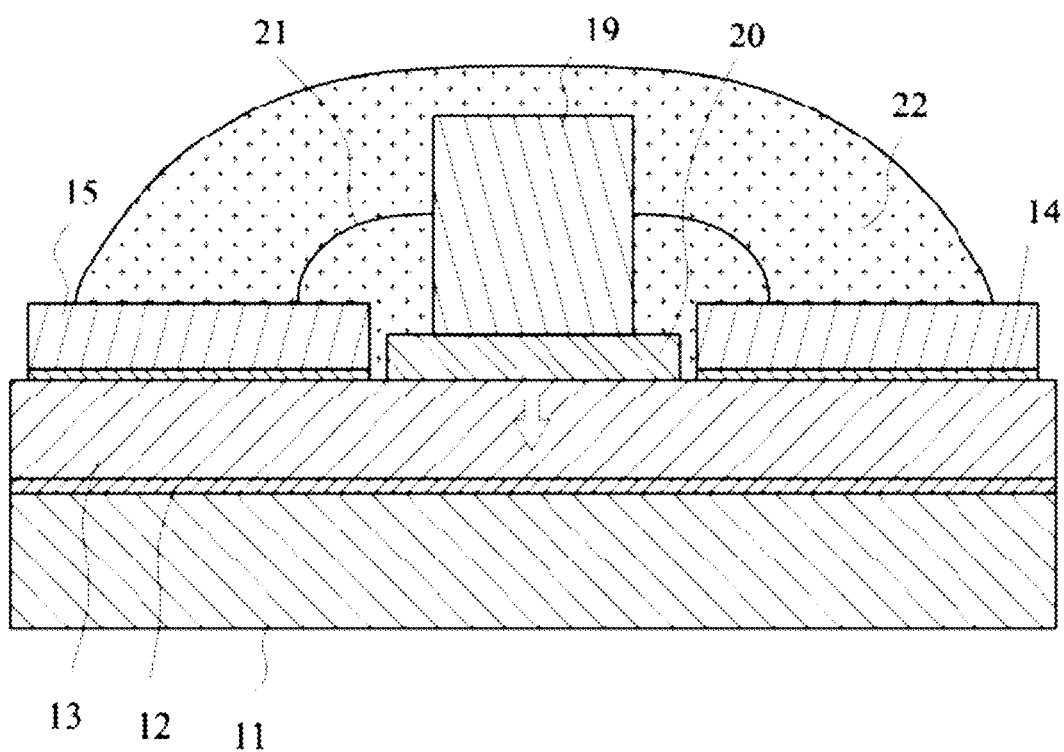
FIG. 7 is a schematically cross-sectional view showing a ceramic/metal composite structure according to a fourth embodiment of the present invention.
Figure 8:
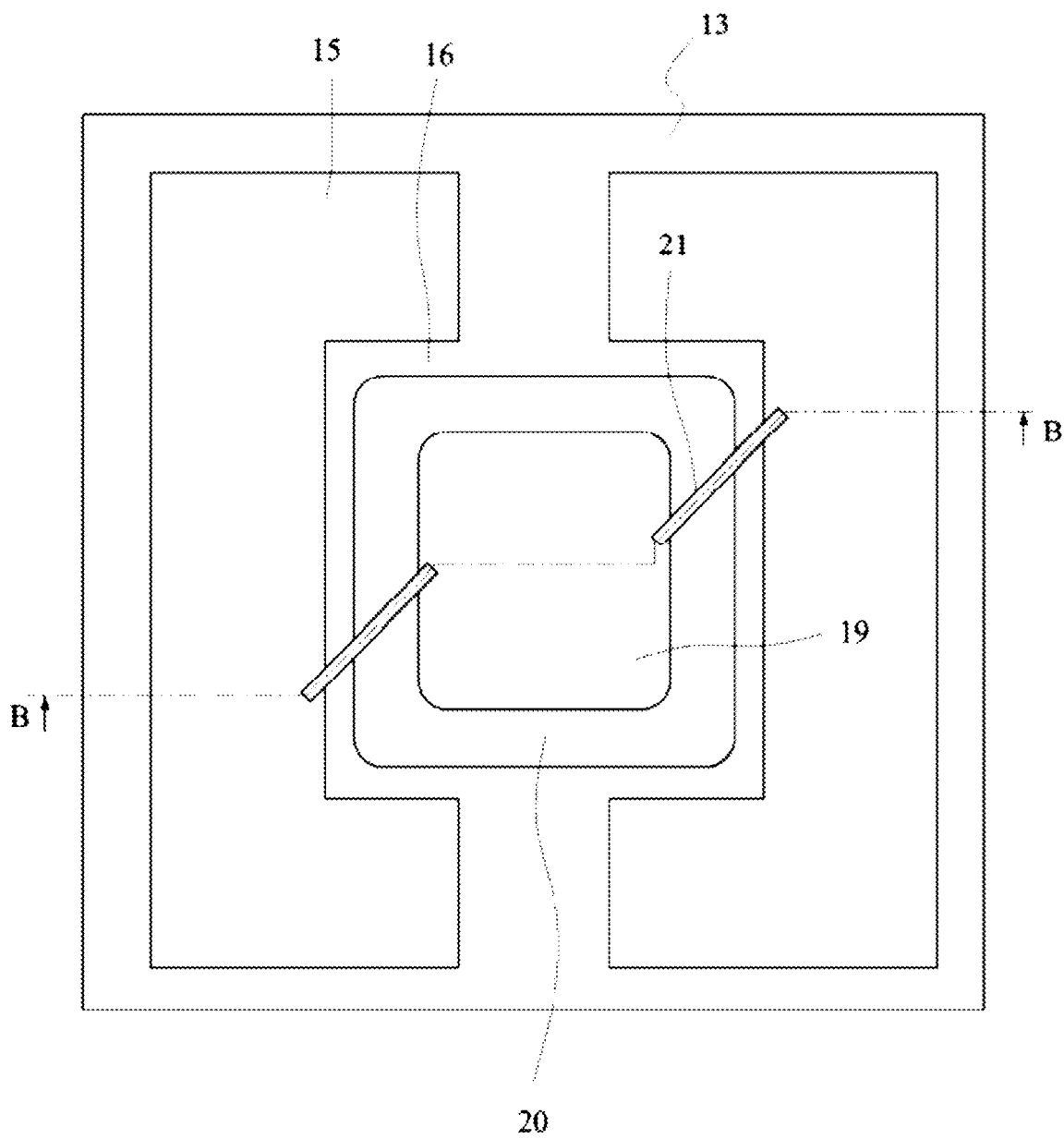
FIG. 8 is a schematic top view showing the ceramic/metal composite structure according to the fourth embodiment of the present invention.

FIG. 7 is a schematically cross-sectional view showing a ceramic/metal composite structure according to a fourth embodiment of the present invention. FIG. 8 is a schematic top view showing the ceramic/metal composite structure according to the fourth embodiment of the present invention. FIG. 7 is a cross-sectional view taken along a line B-B of FIG. 8. For the sake of clearness, a package material 22 is not shown in FIG. 8. Referring to FIGS. 7 and 8, the ceramic/metal composite structure of this embodiment further includes an electronic component 19 disposed on the opening 16 of the upper metal layer 15 and disposed over the ceramic substrate 13. The electronic component 19 may be a central processing unit (CPU), a power component (e.g., a power transistor) or a light-emitting diode (LED). It is to be noted that the electronic component 19 is regarded as one portion of the ceramic/metal composite structure in the fourth embodiment of the present invention.

In order to achieve the better thermal conducting effect, the electronic component 19 is placed over the ceramic substrate 13 through a thermal conductive adhesive or solder 20. The thermal conductive adhesive 20 is formed by mixing an organic polymeric material with a metal or ceramic filler material. The metal or ceramic filler material is selected from the group consisting of silver particles, copper particles, aluminum particles, aluminum oxide particles, aluminum nitride particles, boron carbide particles or titanium boride particles. The solder is either a Sn alloy or an Ag alloy. The thermal conductivity of the thermal conductive adhesive or solder 20 can typically reach above 3 W/mK.

Alternatively, the ceramic substrate 13 in the opening 16 may also exist an upper metal interface layer (not shown). Therefore, the electronic component 19 is placed over the ceramic substrate 13 through the thermal conductive adhesive or solder 20 and the upper metal interface layer 14.

In order to control the electronic component 19, the ceramic/metal composite structure of this embodiment further includes multiple wires 21 for connecting the electronic component 19 to the upper metal layer 15. The package material 22 is composed of the electronic component 19 and the wires 21. Most of the heat outputted from the electronic component 19 is conducted in a direction indicated by the bold arrow shown in FIG. 7.

Figure 9:
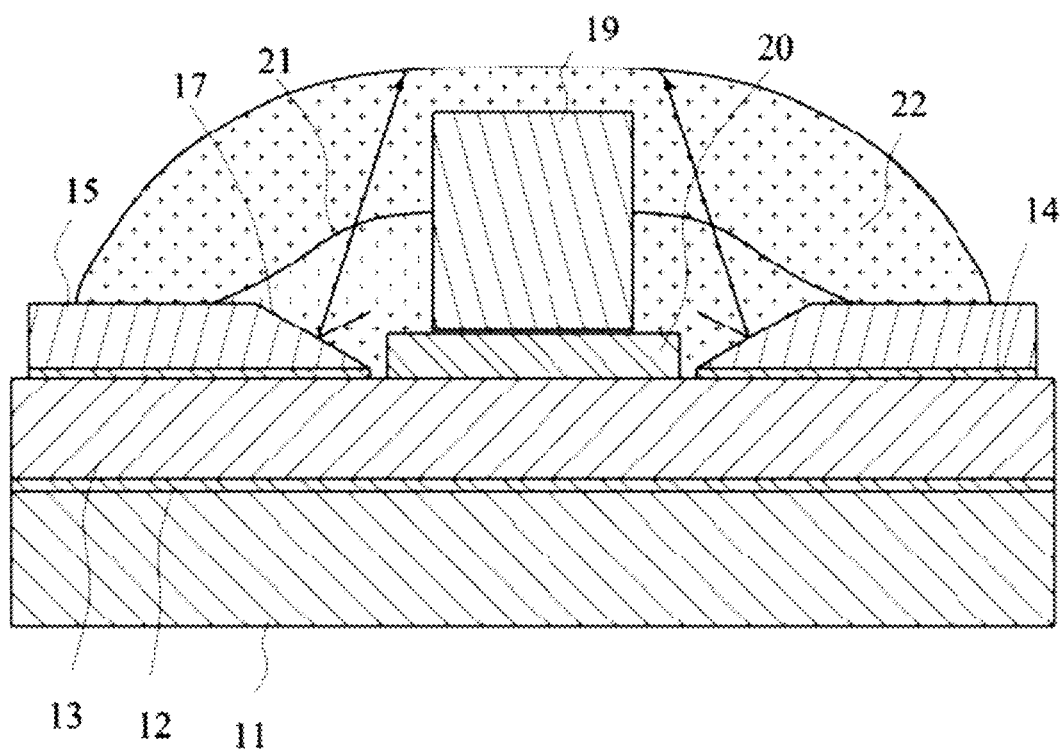
FIG. 9 is a schematically cross-sectional view showing a ceramic/metal composite structure according to a fifth embodiment of the present invention.

FIG. 9 is a schematically cross-sectional view showing a ceramic/metal composite structure according to a fifth embodiment of the present invention. FIG. 9 is similar to FIG. 7. As shown in FIG. 9, the upper metal layer 15 of this embodiment has an inclined surface 17 neighboring upon the opening 16. When the electronic component 19 is the LED, the inclined surface 17 can reflect the secondary light ray of the electronic component 19 upwards to increase the light emitting efficiency of the electronic component 19.

Figure 10:
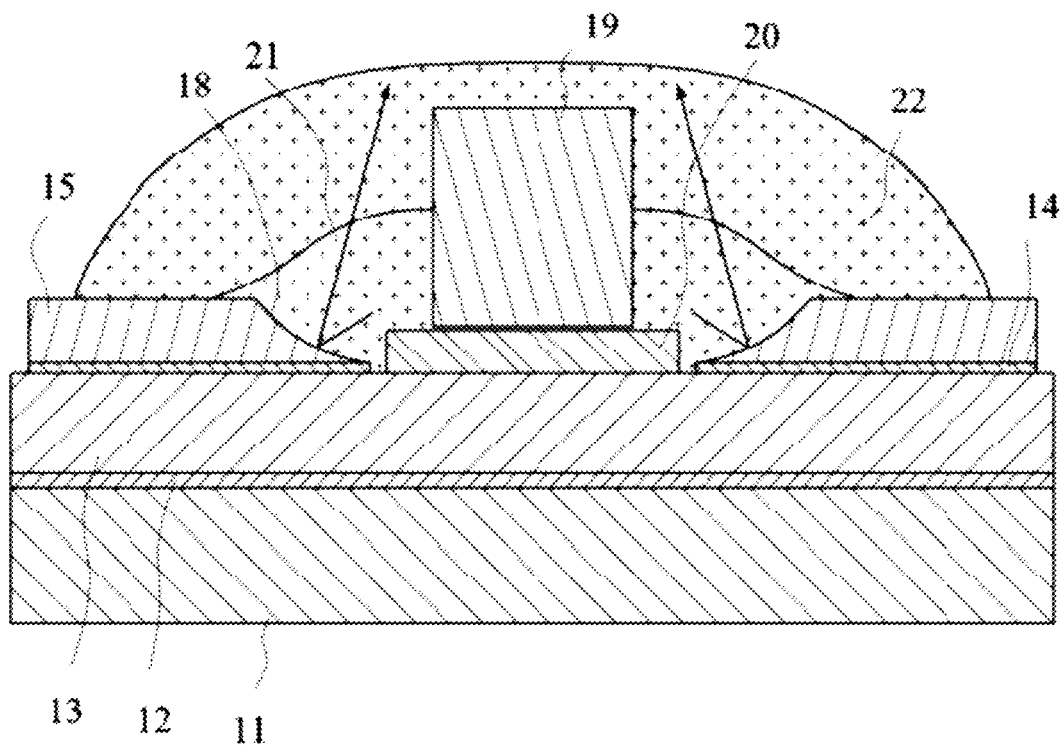
FIG. 10 is a schematically cross-sectional view showing a ceramic/metal composite structure according to a sixth embodiment of the present invention.

FIG. 10 is a schematically cross-sectional view showing a ceramic/metal composite structure according to a sixth embodiment of the present invention. FIG. 10 is similar to FIG. 7. As shown in FIG. 10, the upper metal layer 15 of this embodiment has a curved surface 18 neighboring upon the opening 16. When the electronic component 19 is the LED, the curved surface 18 can also reflect the secondary light ray of the electronic component 19 upwards to increase the light emitting efficiency of the electronic component 19.

Figure 11:
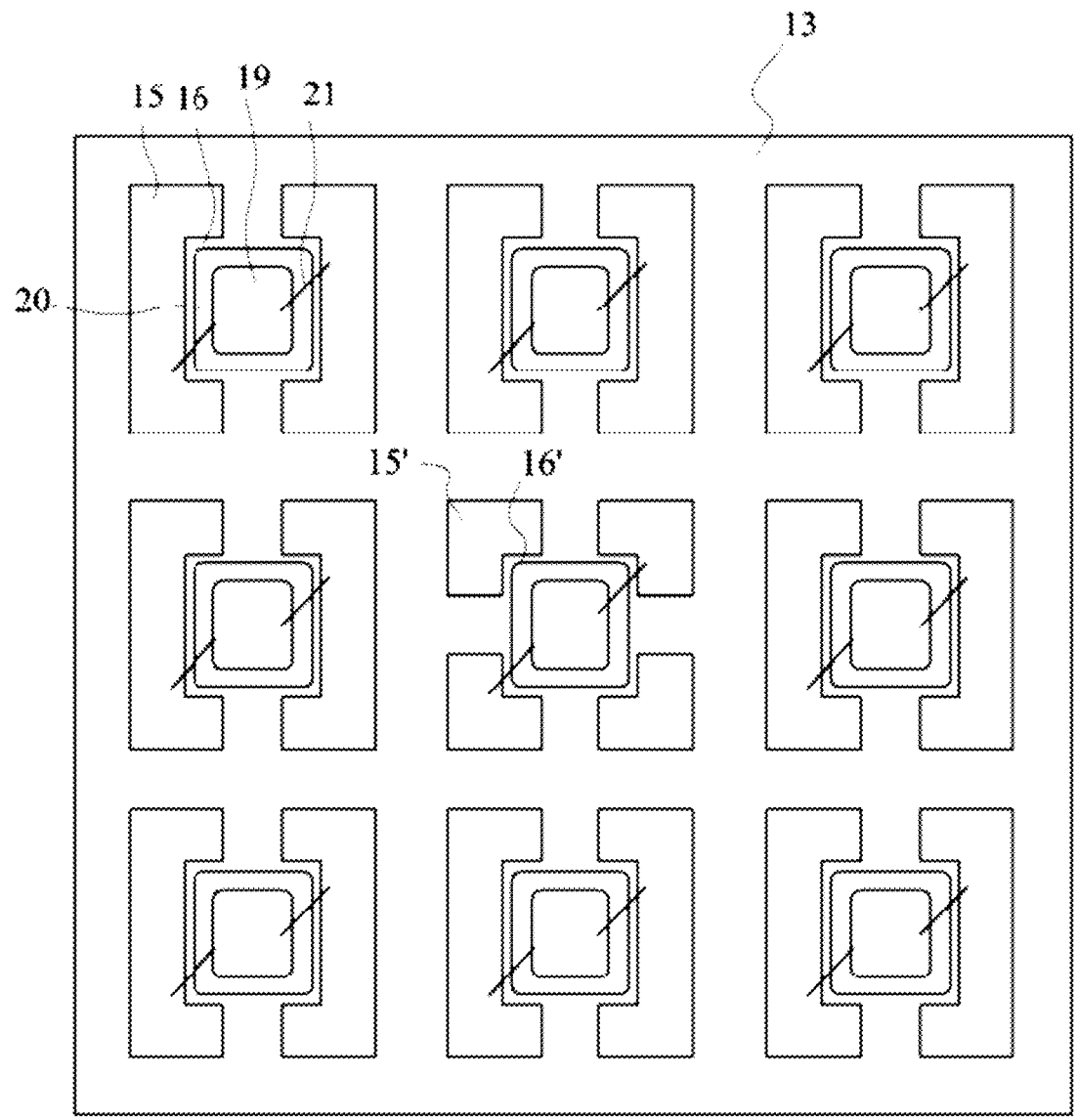
FIG. 11 is a schematic top view showing a ceramic/metal composite structure according to a seventh embodiment of the present invention.

FIG. 11 is a schematic top view showing a ceramic/metal composite structure according to a seventh embodiment of the present invention. As shown in FIG. 11, many sets of electronic components may be arranged in an array and disposed over the ceramic substrate 13. It is to be noted that the middle copper sheet 15' is slightly different from its neighboring copper sheet 15 because the middle copper sheet 15' is divided into four blocks to define the opening 16' while the copper sheet 15 is divided into two blocks to define the opening 16.

The effects of the present invention will be described with reference to several examples.

First Example

Figure 12:
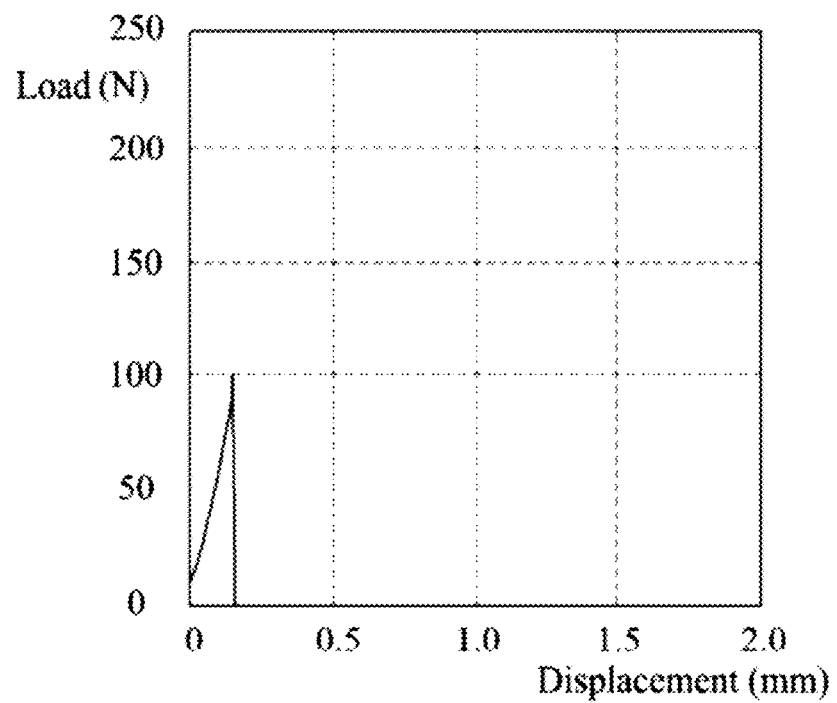
FIG. 12 shows a test result of an aluminum oxide substrate.

The aluminum oxide substrate, which has the purity of aluminum oxide of 96% and has the size of 32×23×0.5 mm, is tested by a universal testing machine (MTS-810, United States MTS Company) according to the 3-point bending method so that the load-displacement behavior of the substrate is obtained. Two lower supporting points to withstand the load are separated by 22.5 mm, and the load applying rate is 0.002 mm/second. The obtained load-displacement curve is shown in FIG. 12. As shown in FIG. 12, after the aluminum oxide substrate is applied with the load of 100 Newtons, an extremely small displacement is generated and the aluminum oxide substrate fails instantaneously. This phenomenon demonstrates a typical brittle failure.

Second Example

Figure 13:
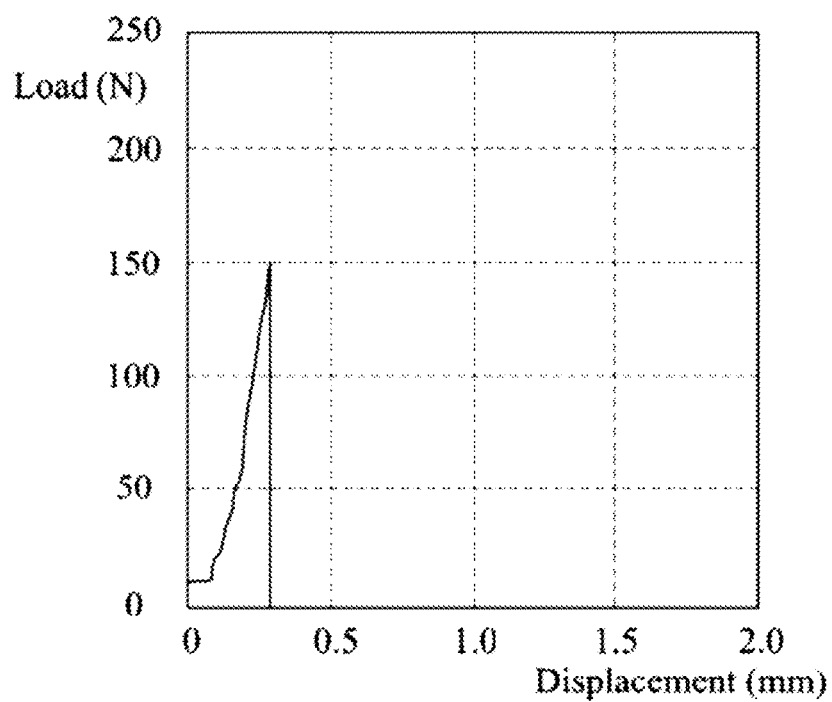
FIG. 13 shows a test result of a composite structure composed of an aluminum oxide substrate and a single-stage pre-oxidized copper sheet.

The aluminum oxide substrate, which is the same as that of the first example, is cleaned by acetone and then joined to two copper sheets, each of which has the size of 26×20×0.3 mm and is pre-oxidized at 1000° C. for 1 hour in an atmosphere with low oxygen partial pressure, to form a sandwiched structure in a temperature-calibrated oven at the high temperature of 1073° C. in nitrogen. The joined composite structure is applied with the 3-point bending test, which is the same as that of the first example, and the obtained load-displacement curve is shown in FIG. 13. The aluminum oxide/copper composite structure withstands the load of 150 Newtons, then the load rapidly decreases. The aluminum oxide substrate within the structure is broken after test, and a large portion of the interface between the aluminum oxide substrate and the copper sheet is separated, and only a small portion of the copper sheet is still joined to the aluminum oxide substrate.

The above-mentioned example proves that the aluminum oxide/copper composite structure can withstand the external load higher than that withstood by the aluminum oxide substrate alone. However, as a larger load is applied, the aluminum oxide/copper composite structure cannot be used any more. As the copper sheet is pre-oxidized in multiple stages, the interface strength can be effectively enhanced. Illustrations will be made with reference to the following example.

Third Example

The aluminum oxide substrate the same as that used in the first example is coated with a nickel-phosphorus alloy layer (metal interface layer) by way of electroless plating. The thickness of this metal nickel-phosphorus alloy layer ranges from 2 to 4 microns. Then, the aluminum oxide substrate is joined to two copper sheets, each of which has a thickness of 0.3 mm and is pre-oxidized by using two stages of pre-oxidation at different temperatures ranging from 50° C. to 700° C. and in different atmospheres with different oxygen partial pressures. The high-temperature joining is carried out in a temperature-calibrated oven at 1058° C. in flowing nitrogen. During the high-temperature joining, the alloy thin layer joins the aluminum oxide sheet and the copper sheet together to form strong bonds therebetween. The temperature 1058° C. is lower than the eutectic point (1066° C.) between copper and copper oxide. So, it is proved that the alloy thin layer of this example can enhance the joining between the aluminum oxide and the copper.

Figure 14:
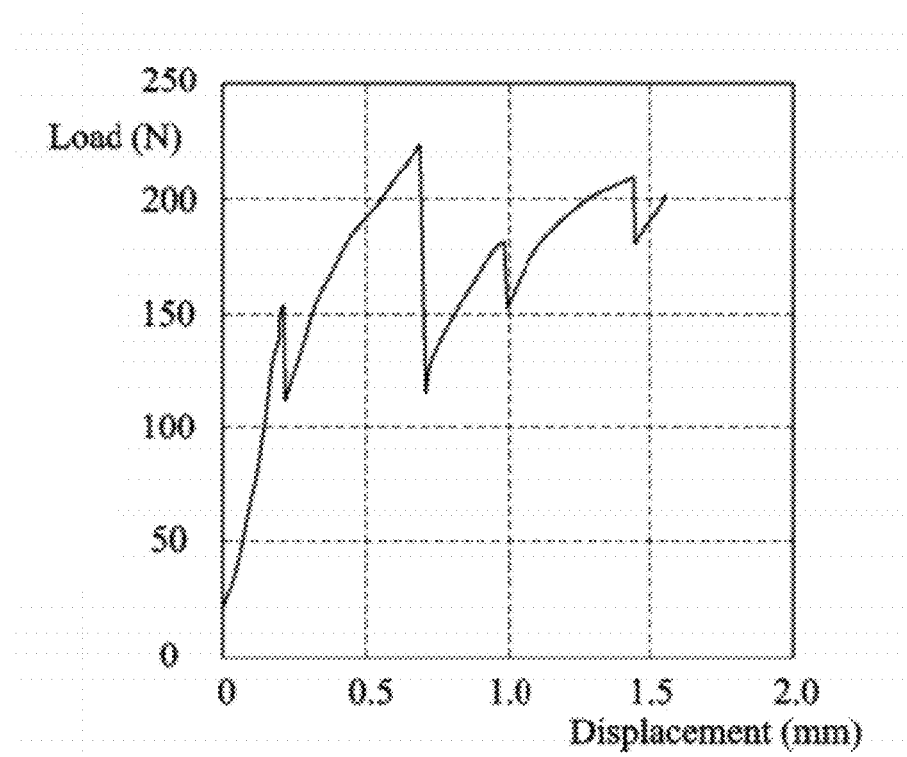
FIGS. 14 to 16 show test results of ceramic/metal composite structures according to the present invention.

The joined aluminum oxide/copper composite structure is tested with the 3-point bending technique the same as that described in first example, and the obtained load-displacement curve is shown in FIG. 14. The aluminum oxide/copper composite structure withstands the load of 155 Newtons, and then the load only slightly decreases to 115 Newtons. Then, the composite structure can withstand the larger load up to 220 Newtons. Next, the load decreases, increases and then decreases. The test terminates when the displacement reaches 1.6 mm, and the composite structure is observed. At this time, the composite structure does not fail after the test, and the aluminum oxide substrate is not separated from the copper sheet, but has a small crack only in the aluminum oxide substrate. The copper sheet still tightly grasps the aluminum oxide sheet so that the integrity of the composite structure can still be kept.

According to the load-displacement curve of FIG. 14, the aluminum oxide substrate forms a crack under the load of 155 Newtons. However, the aluminum oxide substrate is not separated from the copper sheet and thus can withstand the load continuously. At this time, the copper sheet has the plastic deformation. Then, when the load reaches 220 Newtons, the aluminum oxide substrate and the copper sheet have an extremely small separated interface at the first time. So, the load decreases. However, the interface separation amount is very small. If the load is continuously applied, the measured load increases when the interface crack stagnates. When the interface crack grows, the load decreases. After the displacement of 1.6 mm is reached, the composite structure can still have the completeness. The up-down load-displacement curve also shows that the aluminum oxide substrate and the copper sheet are well joined together. However, the chemical reaction products generated by the nickel-phosphorus alloy coating are not continuous. According to the research of Seager et. al. (Seager, C. W., Kokini, K., Trumble, K., Krane, M. J. M., Scripta Materialia, 46, 395, 2002), the discontinuous reaction product of aluminum oxide and copper is advantageous to the joining between aluminum oxide and copper. So, the nickel alloy coating is advantageous to the joining between aluminum oxide and copper. The alloy coating between aluminum oxide and copper can be in the form of a thin layer, points, columns, strips, a porous structure or a multi-layer structure.

The example has proved that the thin nickel alloy layer between the aluminum oxide substrate and the copper sheet can enhance the strength of the composite structure. The coefficient of thermal expansion of nickel ($13 \times 10^{-6} K^{-1}$) and an alloy thereof ranges from the coefficients of thermal expansion of aluminum oxide and of copper. So, the thermal stress between aluminum oxide and copper can be reduced. In addition, the nickel alloy can be simultaneously bonded to the aluminum oxide sheet and the copper sheet so that the interface strength is enhanced. So, the strength of the aluminum oxide/copper composite structure can be increased, and it is extremely advantageous to the increase of the lifetime of the high power electronic components. These components can then be used for several tens of thousand times of on-off cycles.

Fourth Example

The aluminum oxide substrate the same as that used in the first example is coated with a nickel-boron alloy layer by way of electroless plating. The thickness of this metal nickel-boron alloy layer ranges from 1 to 5 microns. Then, the aluminum oxide substrate is joined to two copper sheets, each of which has a thickness of 0.3 mm and is pre-oxidized by using two stages of pre-oxidation at different temperatures ranging from 100° C. to 600° C. and in different atmospheres with different oxygen partial pressures. The high-temperature joining is carried out in a temperature-calibrated oven at 1055° C. in flowing nitrogen. During the high-temperature joining, the alloy thin layer joins the aluminum oxide sheet and the copper sheet together to form strong bonds therebetween. The temperature 1055° C. is lower than the eutectic point (1066° C.) between copper and copper oxide. So, it is proved that the alloy thin layer of this example can enhance the joining between aluminum oxide and copper.

Figure 15:
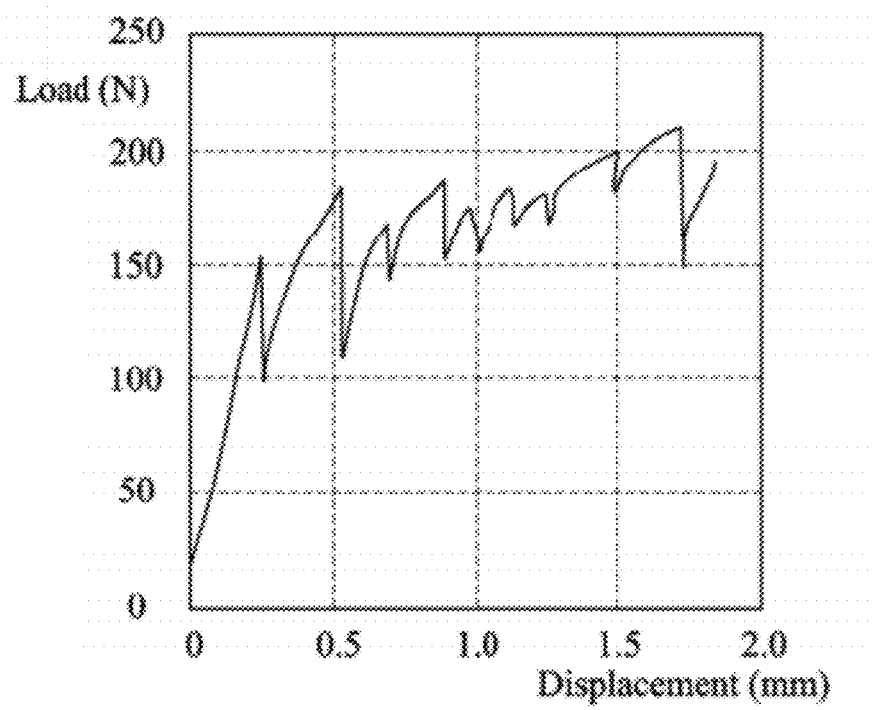

The joined aluminum oxide/copper composite structure is tested with the 3-point bending technique the same as that described in the first example, and the obtained load-displacement curve is shown in FIG. 15. The aluminum oxide/copper composite structure withstands the load of 150 Newtons, and then the load only slightly decreases to 105 Newtons. Then, the composite structure can withstand the larger load up to 185 Newtons. Next, the load decreases, increases and then decreases. The test terminates when the displacement reaches 1.8 mm, and the composite structure is observed. At this time, the composite structure does not fail after the test, and the aluminum oxide substrate is not separated from the copper sheet, but has a small crack only in the aluminum oxide substrate. The copper sheet still tightly grasps the aluminum oxide sheet so that the completeness of the composite structure can still be kept.

Similar to the nickel-phosphorus alloy coating in the third example, the nickel boron alloy coating is advantageous to the joining between aluminum oxide and copper. This example again proves that the thin nickel alloy layer between the aluminum oxide sheet and the copper sheet can enhance the strength of the aluminum oxide/copper composite structure. The coefficient of thermal expansion of the nickel alloy ranges between those of aluminum oxide and of copper. So, the thermal stress between aluminum oxide and copper can be reduced. The phenomenon that the copper wets the surface of the aluminum oxide is observed at the joining edge between aluminum oxide and copper (i.e., the wetting angle between aluminum oxide and copper in this example is smaller than that in the second example), and it represents that the nickel boron alloy can enhance the wetting property of copper on the surface of aluminum oxide. So, the strength of the aluminum oxide/copper composite structure can be increased, and it is extremely advantageous to the increase of the lifetime of the high power electronic component. They can then be used for several tens of thousand times of on-off cycles.

Fifth Example

The aluminum oxide substrate the same as that used in the first example is coated with a copper layer by way of electroless plating. The thickness of this metal alloy layer ranges from 2 to 4 microns. Then, the aluminum oxide substrate is joined to two copper sheets, each of which has a thickness of 0.3 mm and is pre-oxidized by using two stages of pre-oxidation at different temperatures ranging from 100° C. to 600° C. and in different atmospheres with different oxygen partial pressures. The high-temperature joining is carried out in a temperature-calibrated oven at 1056° C. in flowing nitrogen. During the high-temperature joining, the alloy thin layer joins the aluminum oxide sheet and the copper sheet together to form strong bonds therebetween.

Figure 16:
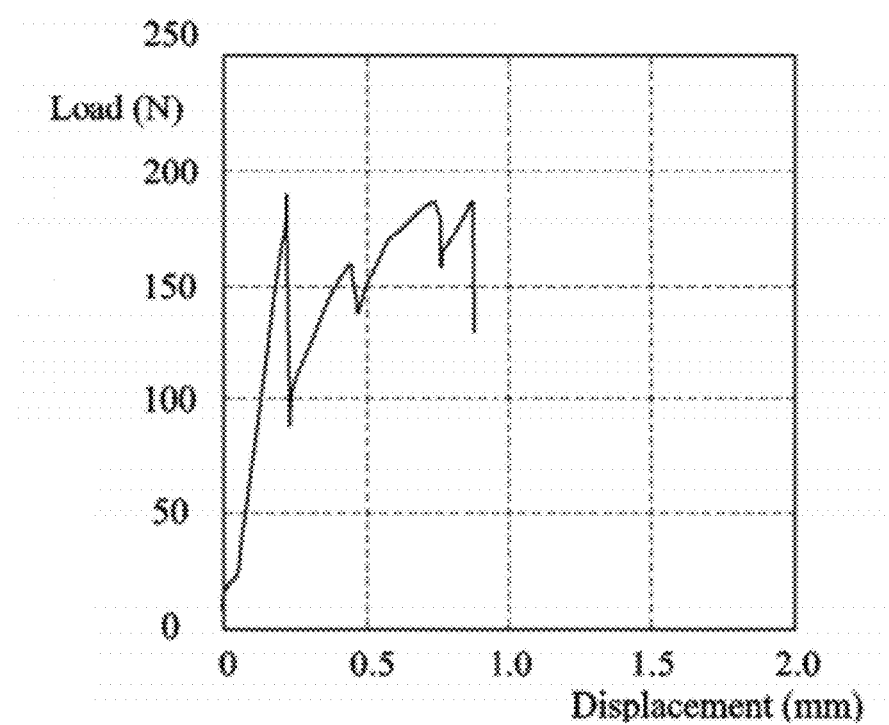

The joined aluminum oxide/copper composite structure is tested with the 3-point bending technique the same as that described in the first example, and the obtained load-displacement curve is shown in FIG. 16. The aluminum oxide/copper composite structure withstands the load of 190 Newtons, and then the load only slightly decreases to 90 Newtons. Then, the composite structure can withstand the larger load up to 160 Newtons. Next, the load decreases, increases and then decreases. The test terminates when the displacement reaches 0.8 mm, and the composite structure is observed. At this time, the composite structure does not fail after the test, and the aluminum oxide substrate is not separated from the copper sheet, but has a small crack only in the aluminum oxide substrate. The copper sheet still tightly grasps the aluminum oxide sheet so that the completeness of the composite structure can still be kept.

This example proves that a thin copper layer coated on the aluminum oxide sheet or the copper sheet can enhance the strength of the composite structure. The existence of the copper layer decreases the wetting angle of the copper sheet on the aluminum oxide sheet so that the interface strength can be enhanced. So, the strength of the aluminum oxide/copper composite structure can be increased by using the metal interlayer, and it is extremely advantageous to the increase of the lifetime of the high power electronic components. These components can then be used for several tens of thousand times of on-off cycles.

In summary, the present invention discloses a composite structure, which is composed of copper and aluminum oxide and provides the basic heat dissipating and insulating ability. Because the copper has the extremely low resistivity of only $10^{-4}$ Ωm, various patterns or electric connection points can be formed onto the copper sheet. The composite structure can be packaged with the high power electronic components. Both the good electrical connecting and heat dissipating properties can be achieved. In addition, the two-stage pre-oxidizing process is performed on the copper sheet to process the surface thereof with lower joining temperatures and short joining times. In addition, the composite structure has the high interface strength. So, it is extremely advantageous to the increase of the lifetime of the high power electronic components. They can then be used for several tens of thousand times of on-off cycles.

Eighth Embodiment

The applicants found out that a proper oxygen content in the direct bond copper (DBC) technology is advantageous to the wetting effect. When the oxygen content in the liquid phase is increased, the amount of the liquid phase produced during bonding is also increased. The oxygen contents of four copper sheets, with the thickness of 0.33 mm, treated with four multi-stage pre-oxidizing conditions are listed in TABLE 1, wherein the oxygen contents are 0.08%, 0.13%, 0.23% and 0.64%, respectively

TABLE 1

| | Pre-oxidation condition | Oxygen content (at %) |
|---|---|---|
| I | 600° C. in $N_2$ for 3 min. | 0.08 |
| II | 600° C. in $N_2$ for 3 min. + 200° C. in Air for 10 min. | 0.13 |
| III | 300° C. in Air for 1 min. + 600° C. in $N_2$ for 3 min. | 0.23 |
| IV | 600° C. in $N_2$ for 3 min. + 400° C. in Air for 1 min. | 0.64 |

Figure 17:
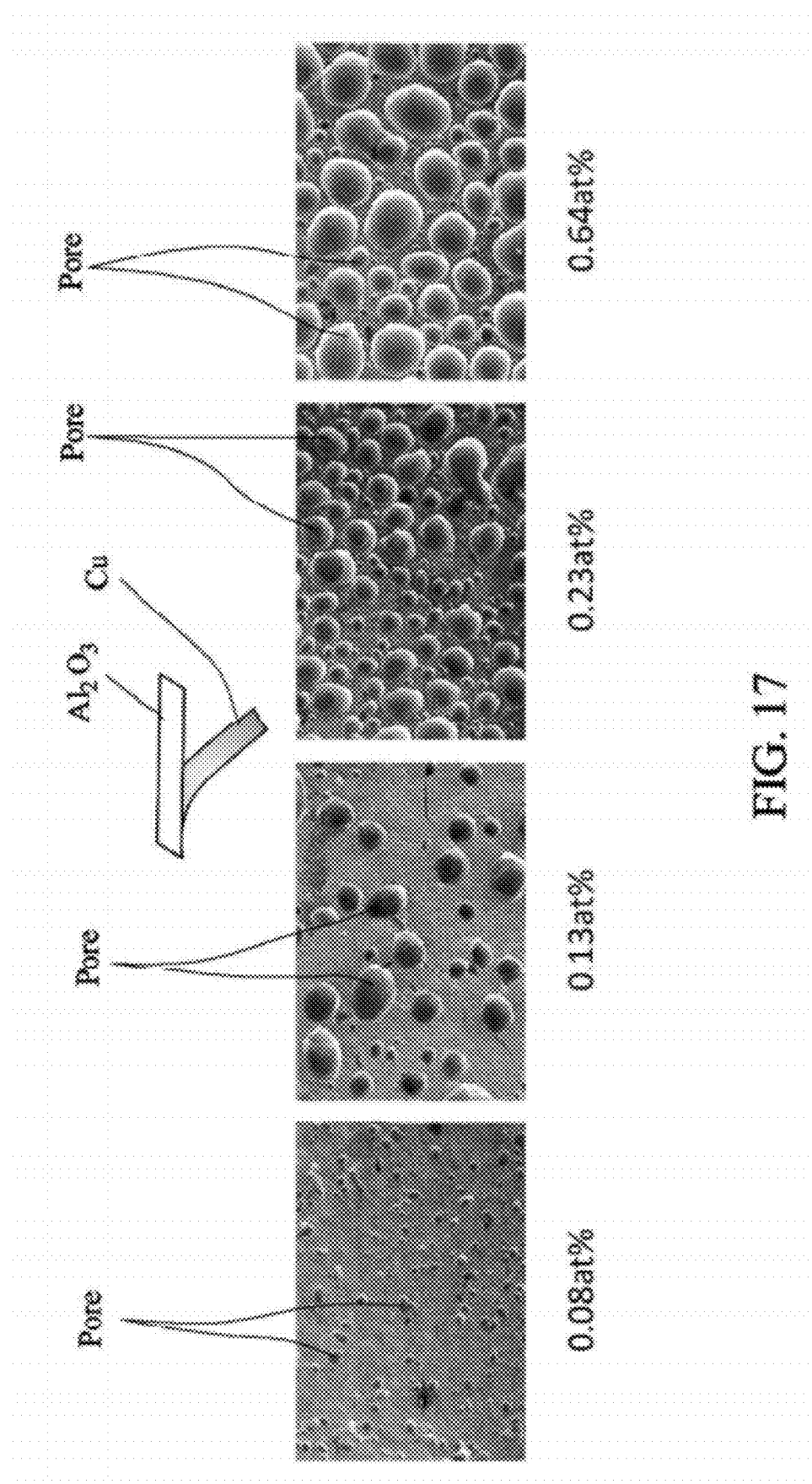
FIG. 17 shows microstructures on the surface of the copper (Cu) sheet observed after the bonded aluminum oxide ($Al_2O_3$) substrate and Cu sheet are peeled off.

After the four copper sheets are bonded with aluminum oxide substrates, the high oxygen content causes a lot of $Cu_2O$ to be precipitated, while the gas reaction is accompanied so that a lot of pores are left on the interface, wherein the results thereof are shown in FIG. 17. FIG. 17 shows microstructures on the surface of the copper (Cu) sheet observed after the bonded aluminum oxide ($Al_2O_3$) substrate and Cu sheet are peeled off.

Figure 18:
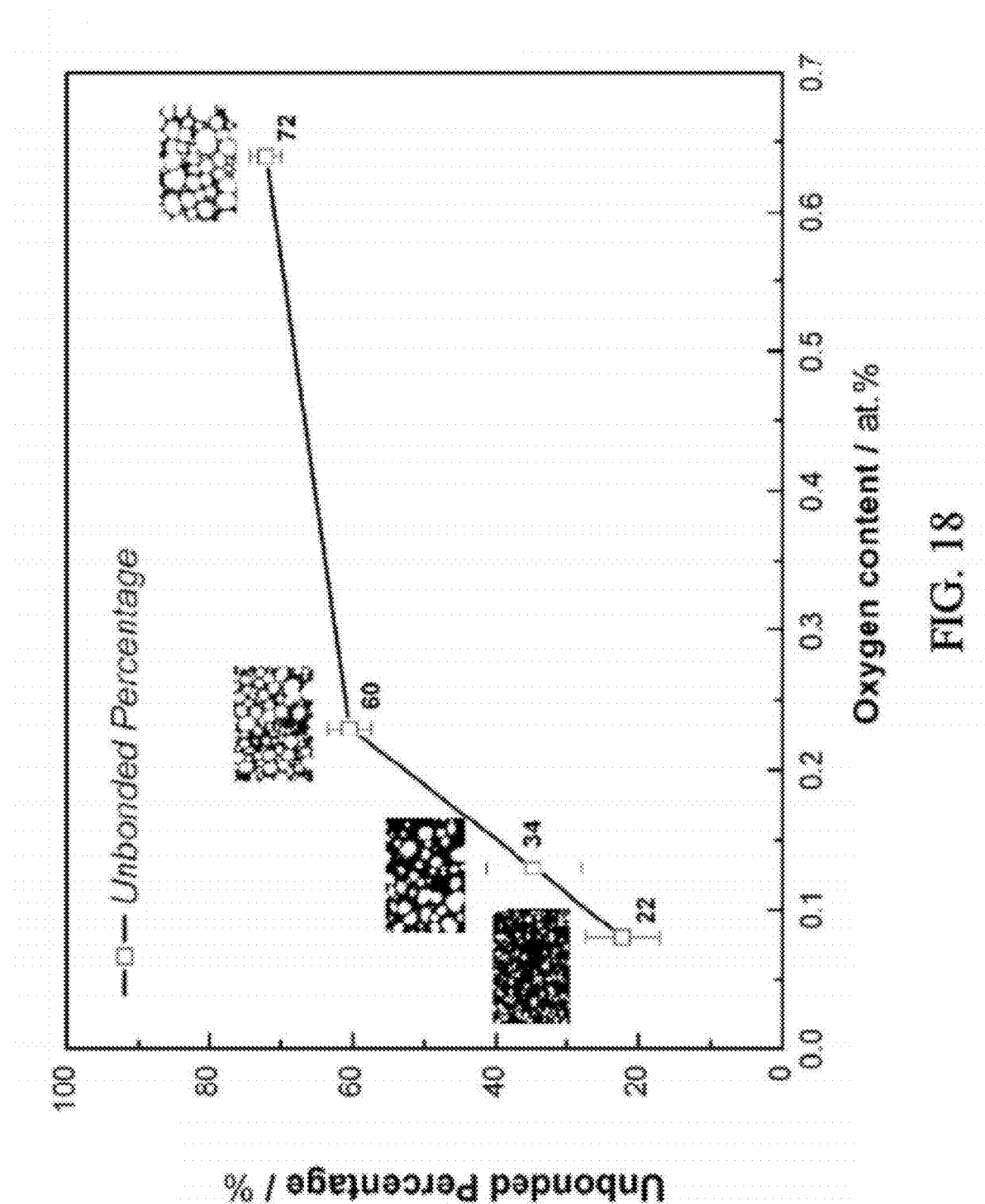
FIG. 18 is a graph showing the unbonded percentages obtained after the copper sheets with different oxygen contents are directly bonded to the aluminum oxide substrates.

As shown in FIG. 17, it is found out that the size and the number of the pores are increased with the increase of the oxygen content. The unbonded percentages between the copper sheet and the aluminum oxide substrate can be calculated with reference to the pores of FIG. 17, and the calculated results are shown in FIG. 18. As shown in FIG. 18, it is found out that the unbonded percentage is increased with the increase of the oxygen content, which means that the bonding strength is poor and the thermoconductive effect is deteriorated with the increase of the oxygen content.

Figure 19B:
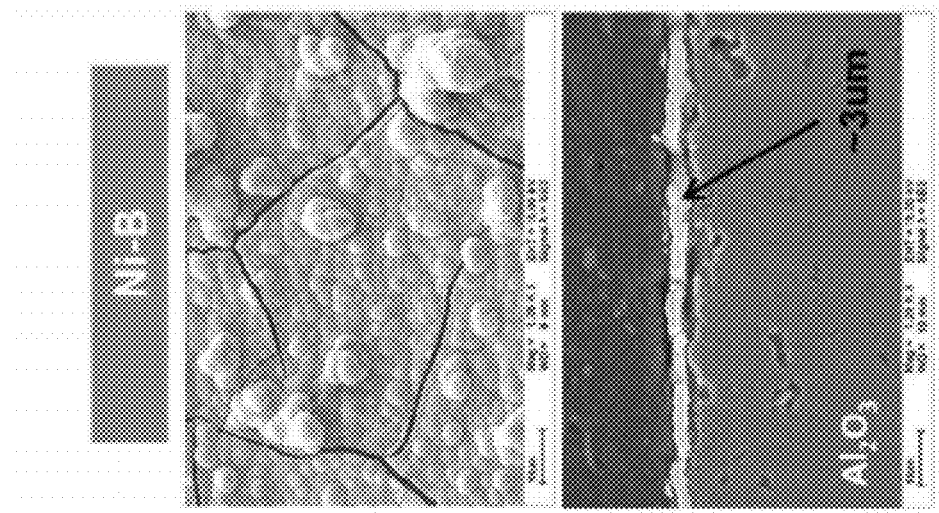
FIGS. 19A and 19B are photomicrographs showing polycrystalline 96% aluminum oxide substrates, on which the nickel alloy layers with several microns are respectively formed by way of electroless plating.
Figure 19A:
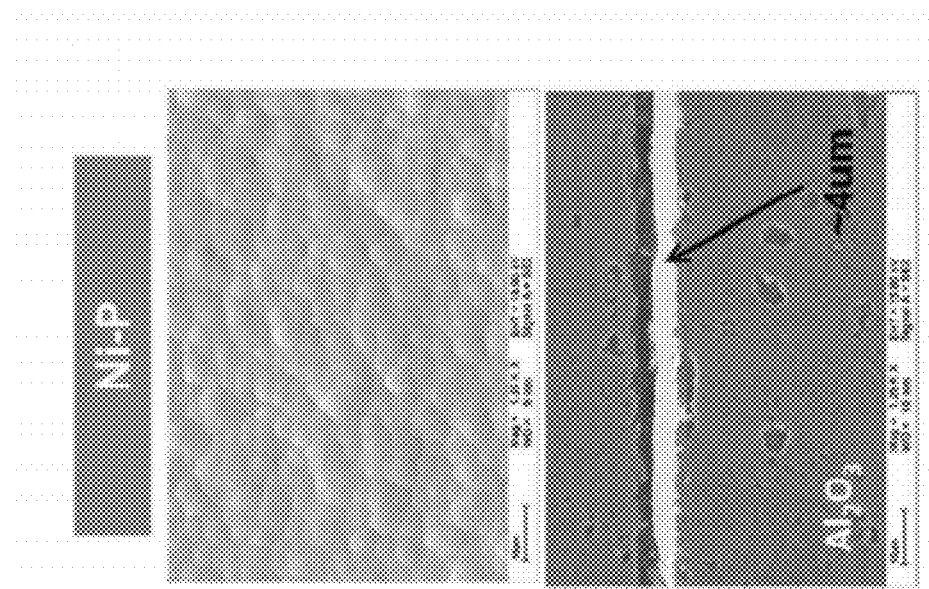

In order to solve to the problem of the pores, the applicants try to modify the property of the surface of the aluminum oxide substrate. First, nickel alloy layers with the thicknesses of several microns are formed on polycrystalline 96% aluminum oxide substrates, respectively, by way of electroless plating. In this embodiment, a nickel-phosphorus (Ni—P) alloy of 4 microns and a nickel-boron (Ni—B) alloy of 3 microns are formed on two polycrystalline 96% aluminum oxide substrates by way of electroless plating, wherein the photomicrographs are shown in FIGS. 19A and 19B, respectively. In FIGS. 19A and 19B, the upper photos represent the top views, and the lower photos represent the cross-sectional side views.

Figure 20:
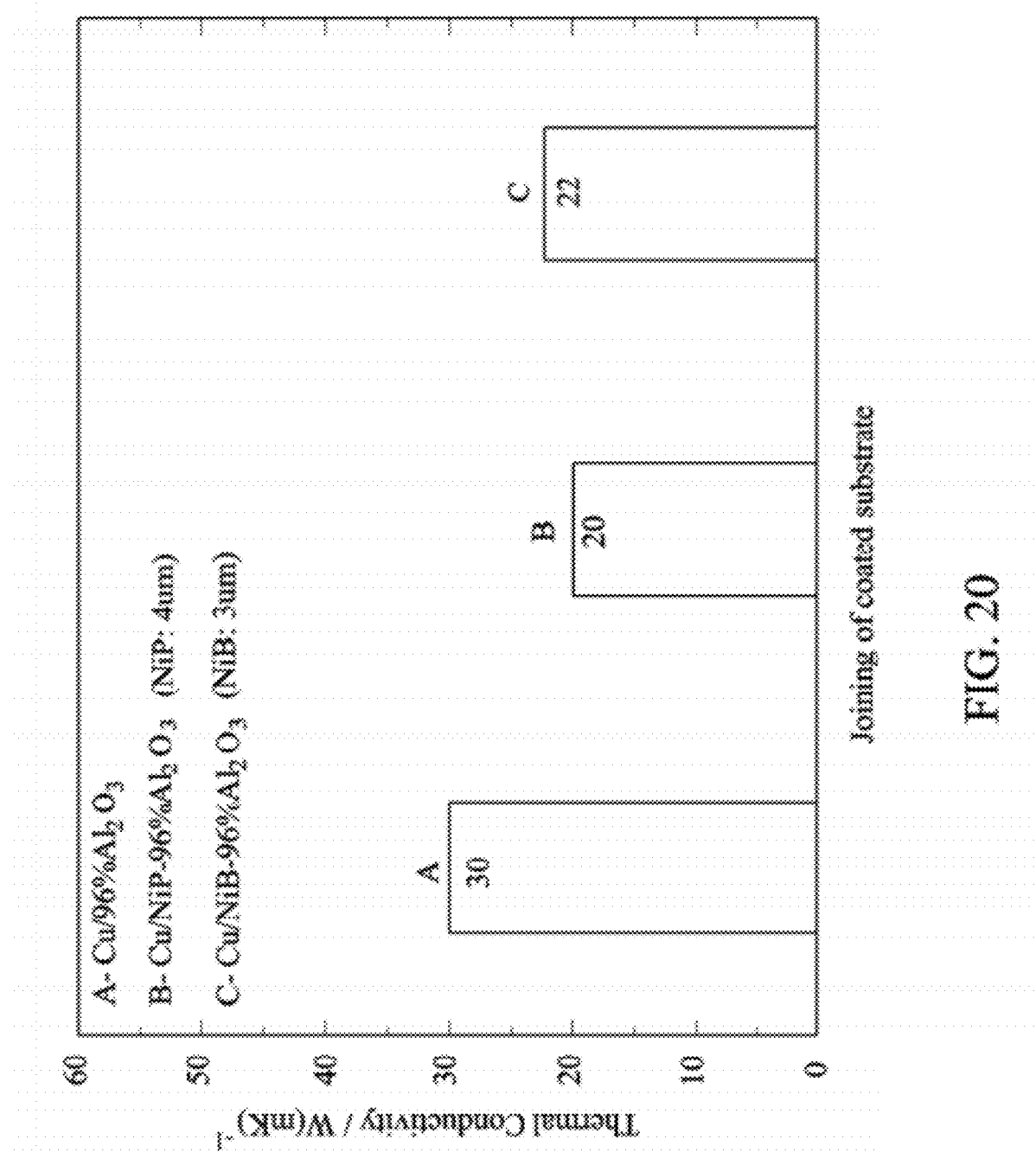
FIG. 20 is a histogram showing thermal conductivities of three bonded ceramic/metal composite structures.

Then, the copper sheets treated with multiple stages of pre-oxidizing processes are thermally bonded to the samples of FIGS. 19A and 19B, respectively, and the thermal conductivities of the bonded samples are measured with the results shown in FIG. 20. As shown in FIG. 20, it is found out that the thermal conductivity is decreased by about 30% after the polycrystalline 96% aluminum oxide is bonded to the copper sheet through the nickel alloy layer.

Figure 21B:
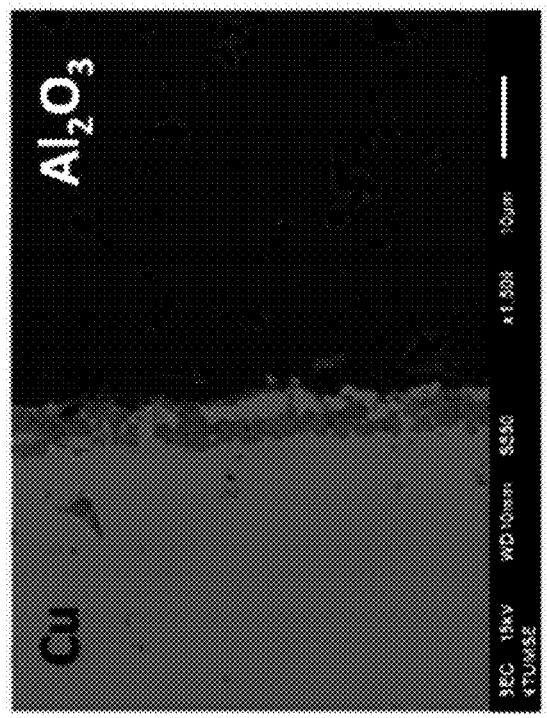
FIGS. 21A, 21B, 22A, 22B and 22C show photomicrographs of two bonded ceramic/metal composite structures.
Figure 21A:
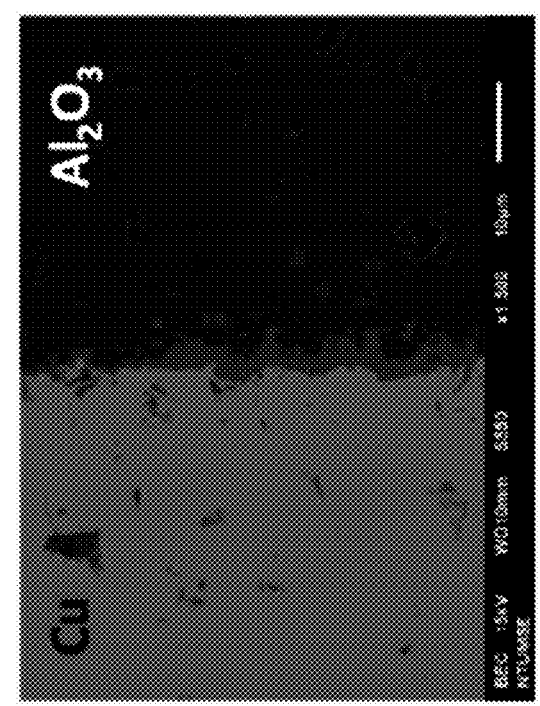
Figures 22A, 22B:
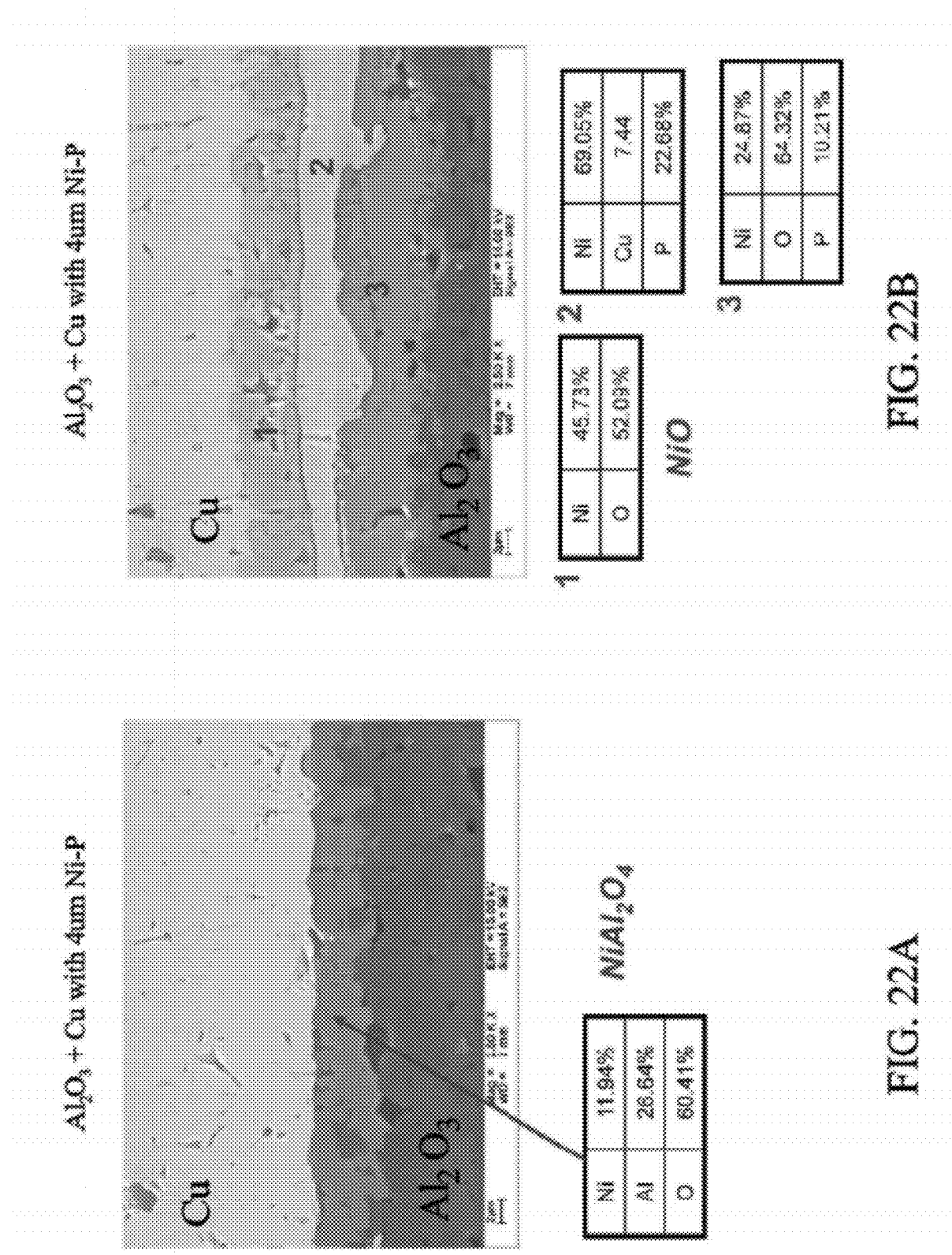
Figure 22C:
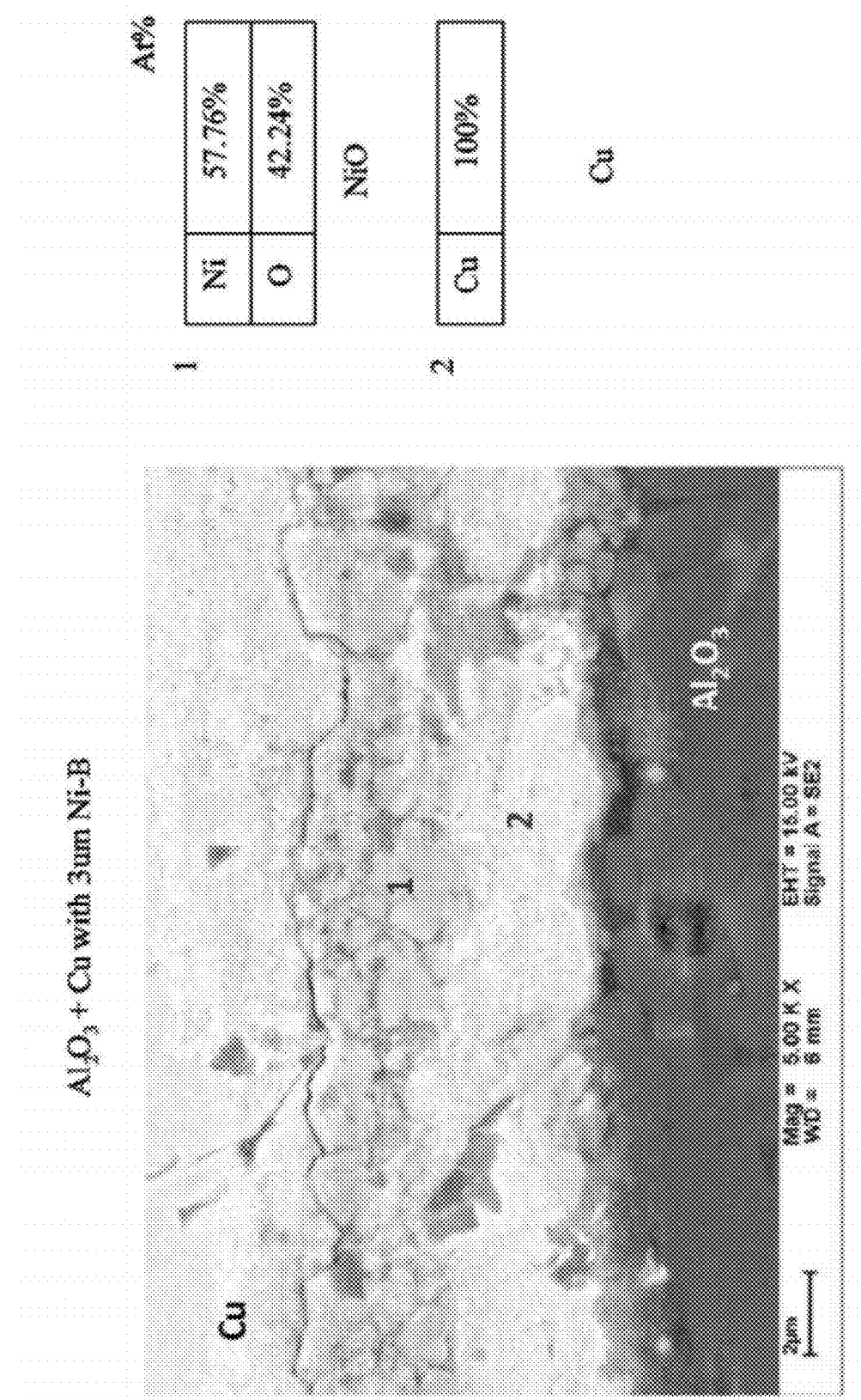

Next, the interface structures are observed with the results shown in FIGS. 21A and 21B. FIG. 21A is enlarged, and two sections of the bonding surface are shown in FIGS. 22A and 22B. In FIG. 22A, a $NiAl_2O_4$ layer is formed between the Cu layer and the $Al_2O_3$ layer. In FIG. 22B, NiO, Ni—Cu—P and Ni—O—P layers are formed between the Cu layer and the $Al_2O_3$ layer. These layers affect the bonding strength and the thermal conductivity. FIG. 21B is enlarged, and the result of the bonding surface is shown in FIG. 22C. In FIG. 22C, the Cu layer is bonded to the $Al_2O_3$ layer, but a portion of NiO is mixed with the Cu layer, and this affects the bonding strength and the thermal conductivity.

Figure 23B:
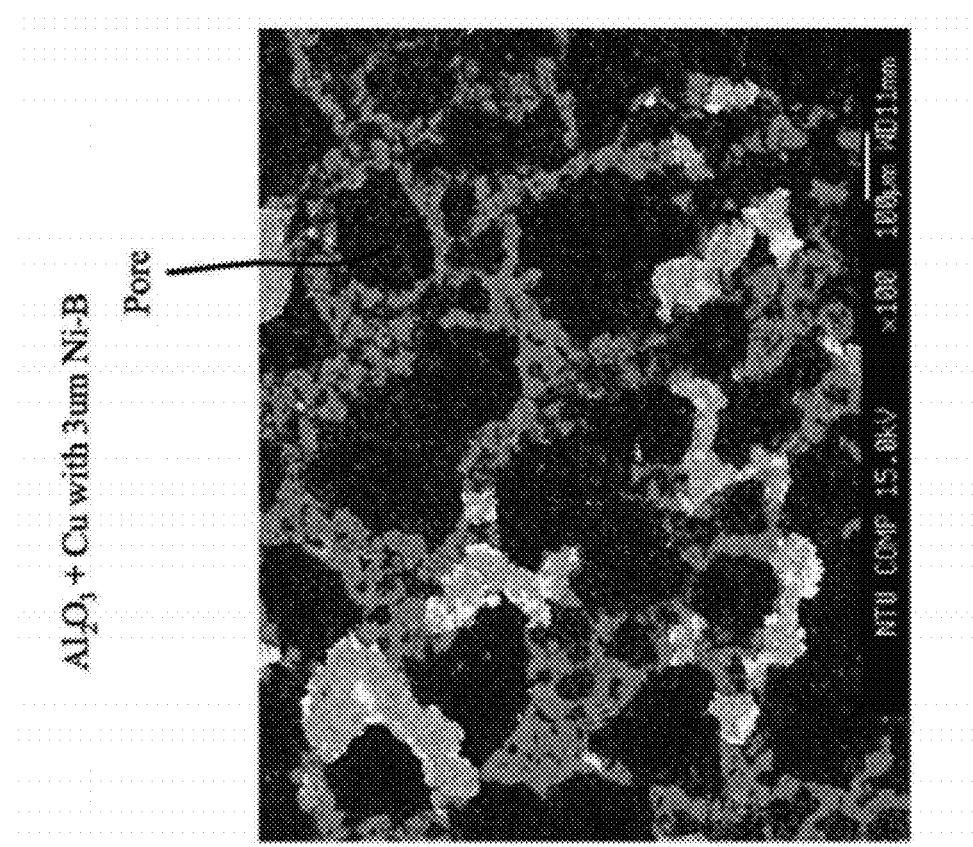
FIGS. 23A to 23C show photomicrographs of three bonded ceramic/metal composite structures.
Figure 23A:
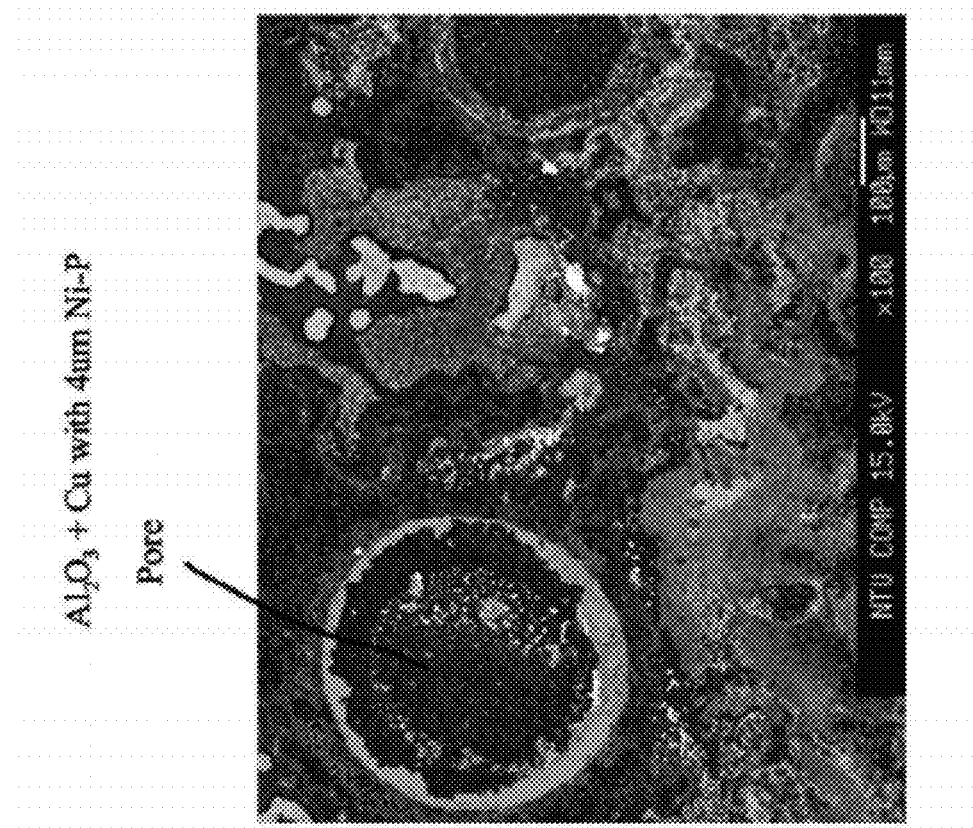
Figure 23C:
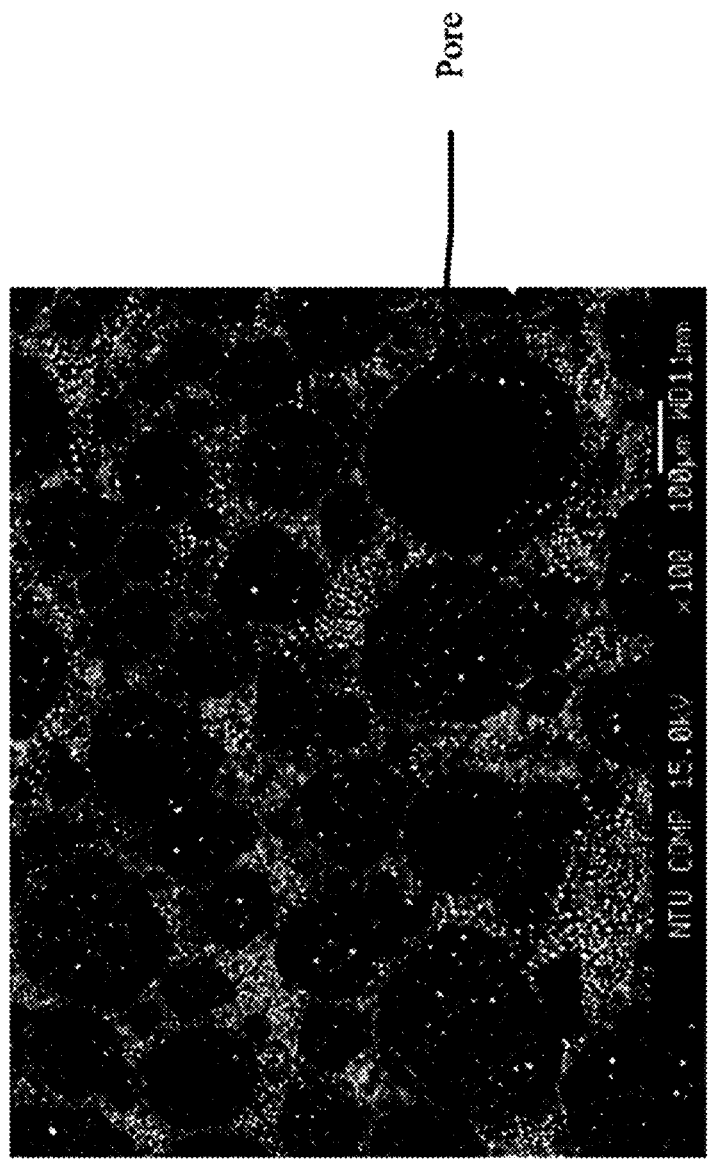

The copper sheet and the polycrystalline 96% aluminum oxide in each of the two samples of Cu/Ni—P-96% $Al_2O_3$ and Cu/Ni—B-96% $Al_2O_3$ are separated from each other, and the surfaces of the copper sheets are observed with the results shown in FIGS. 23A and 23B, respectively. It is found out that the surfaces of the copper sheets of the three samples have the relatively large pores. Thus, when the nickel alloy layer with the thickness greater than 1 micron is used to bond the copper sheet to the aluminum oxide substrate, the bonding result is poor, and the remained interface coating layer and oxide and the pores significantly deteriorate the bonding strength and significantly decrease the thermal conductivity. Although the effect of the invention can be achieved, the bonding still has to be improved. For the sake of comparison, the photomicrograph of the section of the bonding surface between the copper sheet and the aluminum oxide substrate without the nickel alloy layer is also shown in FIG. 23C. As shown in FIG. 23C, it is found out that relatively large pores are formed.

Figure 24:
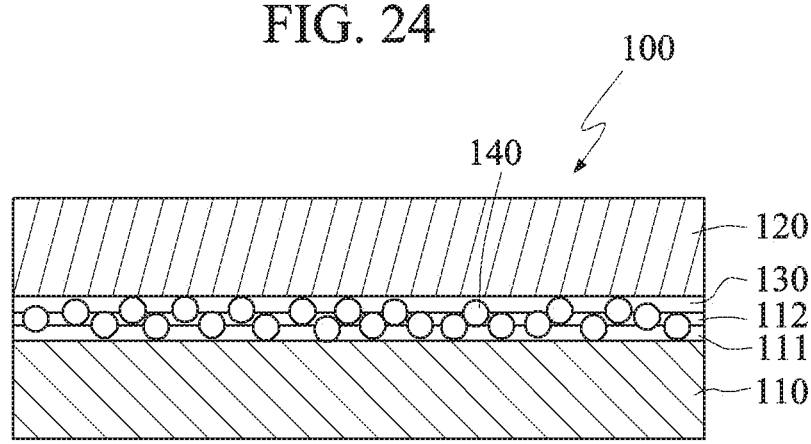
FIG. 24 is a schematic illustration showing a ceramic/metal composite structure according to an eighth embodiment of the invention.

FIG. 24 is a schematic illustration showing a ceramic/metal composite structure 100 according to the eighth embodiment of the invention. Referring to FIG. 24, the ceramic/metal composite structure 100 includes an aluminum oxide substrate 110, an aluminum nickel compound layer 111, a residual nickel alloy layer 112, an interface bonding layer 130 and a copper sheet 120 stacked in order. The aluminum nickel compound layer 111 and the residual nickel alloy layer 112 deteriorate the property of the ceramic/metal composite structure 100.

Ninth Embodiment

According to the eighth embodiment, the applicants found out that the thickness of the metal interface layer affects the bonding strength between the aluminum oxide substrate and the copper sheet and the thermal conductivity of the bonded product when the metal interface layer is used to bond the aluminum oxide substrate to the copper sheet treated with multiple stages of pre-oxidizing processes. In the following, the nickel alloy layer will be illustrated as an example of the metal interface layer. However, those skilled in the art should understand that the other metal interface layer can be applied to the invention.

Figure 25A:
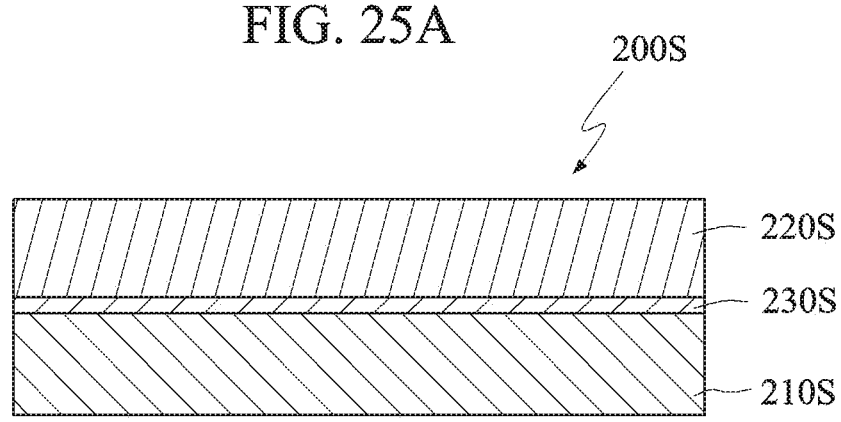
FIGS. 25A and 25B are schematic illustrations showing a semi-facture and a facture of a ceramic/metal composite structure according to a ninth embodiment of the invention.
Figure 25B:
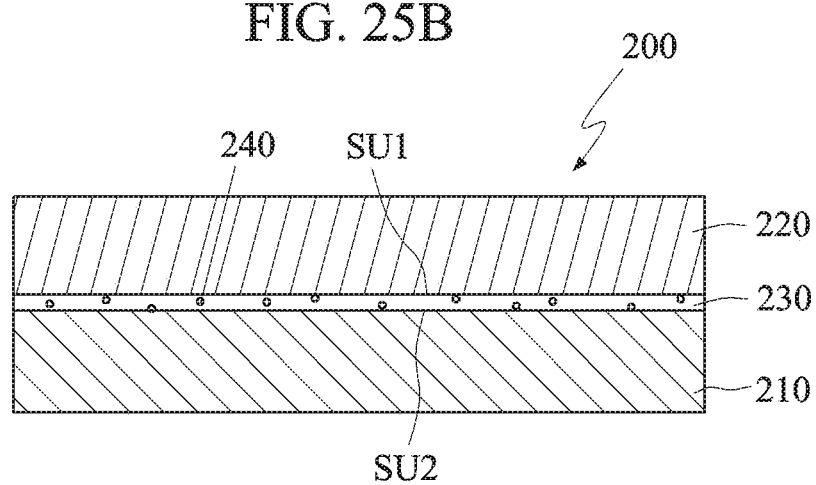

FIGS. 25A and 25B are schematic illustrations showing a semi-facture and a facture of a ceramic/metal composite structure according to a ninth embodiment of the invention. Referring to FIG. 25A, the semi-facture 200S of the ceramic/metal composite structure includes an aluminum oxide substrate 210S, a nickel alloy interface layer 230S and a copper sheet 220S. The nickel alloy interface layer 230S is disposed on the aluminum oxide substrate 210S, and the thickness of the nickel alloy interface layer 230S is smaller than or equal to 1000 nanometers, preferably ranges from 50 to 500 nanometers, more preferably ranges from 200 to 300 nanometers. The copper sheet 220S is disposed on the nickel alloy interface layer 230S. The aluminum oxide substrate 210S, the nickel alloy interface layer 230S and the copper sheet 220S are heated so that the nickel alloy interface layer 230S forms strong bonds with the aluminum oxide substrate 210S and the copper sheet 220S. The nickel alloy interface layer 230S reacts with the copper sheet 220S to form an interface bonding layer. Preferably, the nickel alloy interface layer 230S almost does not react with the aluminum oxide substrate 210S, and does not find a trace.

Referring to FIG. 25B, the ceramic/metal composite structure 200 includes an aluminum oxide substrate 210, an interface bonding layer 230 and a copper sheet 220 stacked in order from bottom to top, wherein the interface bonding layer 230 is interposed between the aluminum oxide substrate 210 and the copper sheet 220. The aluminum oxide substrate 210 is separated from the copper sheet 220 by the interface bonding layer 230, and an interface surface SU1 between the copper sheet 220 and the interface bonding layer 230 and an interface surface SU2 between the interface bonding layer 230 and the aluminum oxide substrate 210 extend in substantially the same direction. The interface bonding layer 230 is directly disposed on the aluminum oxide substrate 210. The copper sheet 220 is directly disposed on the interface bonding layer 230 and is entirely separated from the aluminum oxide substrate 210 by the interface bonding layer 230. The interface bonding layer 230 directly bonds the aluminum oxide substrate 210 to the copper sheet 220. That is, the aluminum oxide substrate 210, the interface bonding layer 230 and the copper sheet 220 are stacked in order. According to the photos of the following examples, it is found out that the interface bonding layer 230 still has pores 240, but the sum of the cross-sectional areas of the pores 240 is substantially smaller than or equal to 25% of the cross-sectional area of the interface bonding layer 230, which means that the porosity of the interface bonding layer 230 is smaller than or equal to 25%. Preferably, the porosity is smaller than or equal to 22%. More preferably, the porosity is smaller than or equal to 10% or 6%. The amounts of the aluminum nickel compound layer and the residual nickel alloy layer are extremely small, so that the bonding strength and the thermal conductivity of the ceramic/metal composite structure 200 are better than those of the eighth embodiment. The material of the interface bonding layer 230 includes, without limitation to, a copper nickel alloy, which includes, without limitation to, a copper-nickel-phosphorus alloy or a copper-nickel-boron alloy. The material of the aluminum oxide substrate 210 includes, without limitation to, the polycrystalline 96% aluminum oxide or the sapphire.

The substrate material, the coating material/thickness and the thermal conductivity of each of Samples 1 to 12 are listed in TABLE 2. As shown in TABLE 2, it is found out that the change of the thermal conductivity is not great after the 96% Al$_2$O$_3$ substrate is coated with the coating layer, but the change of the thermal conductivity is greater after the sapphire substrate is coated with the coating layer.

TABLE 2

| Sample | Substrate | Coating material/ thickness | Thermal conductivity (W/mK) |
|---|---|---|---|
| 1. | 96% Al$_2$O$_3$ | None | 19 |
| 2. | Sapphire | None | 36 |
| 3. | 96% Al$_2$O$_3$ | Ni—P/50 nm | 19 |
| 4. | 96% Al$_2$O$_3$ | Ni—P/1 um | 20 |
| 5. | 96% Al$_2$O$_3$ | Ni—P/2 um | 20 |
| 6. | 96% Al$_2$O$_3$ | Ni—P/4 um | 20 |
| 7. | 96% Al$_2$O$_3$ | Ni—B/1 um | 27 |
| 8. | 96% Al$_2$O$_3$ | Ni—B/3 um | 22 |
| 9. | Sapphire | Ni—P/50 nm | 29 |
| 10. | Sapphire | Ni—P/250 nm | 29 |
| 11. | Sapphire | Ni—P/1.5 um | 28 |
| 12. | Sapphire | Ni—P/8 um | 29 |

The data of TABLE 3 may be obtained after each of the samples in TABLE 2 are bonded to the copper sheet treated with multiple stages of pre-oxidizing processes. The multiple stages of pre-oxidizing processes are the same as those of the above-mentioned embodiments and can effectively enhance the interface strength between the copper sheet and the aluminum oxide substrate. So, detailed descriptions thereof will be omitted. The substrate material, the coating material/thickness, the thermal conductivity and the porosity of each of the bonded Samples 1 to 12 are listed in TABLE 3. As shown in TABLE 3, it is found out that the porosity corresponding to the coating thickness smaller than or equal to 1 micron is kept smaller than or equal to 22%, as shown in Sample 7. This means that the bonded area percentage is higher than 78%. According to the experimental error and the reasonable deduction, the porosity corresponding to the coating thickness smaller than or equal to 1 micron should be kept smaller than or equal to 25% without significantly decreasing the thermal conductivity and without significantly affecting the bonding strength. This means that the bonded area percentage is higher than 75%. More specifically, the porosity corresponding to the coating thickness smaller than or equal to 1 micron is kept smaller than or equal to 9%, as shown in Sample 9. This means that the bonded area percentage is higher than 91%. According to the experimental error and the reasonable deduction, the porosity corresponding to the coating thickness smaller than or equal to 1 micron should be kept smaller than or equal to 15% without significantly decreasing the thermal conductivity. This means that the bonded area percentage is higher than 85%. The porosity corresponding to the coating thickness greater than or equal to 2 microns is greater than 30%, and the bonded samples have the smaller thermal conductivity or the insufficient bonding strength to cause separation so that the advanced requirements of the invention cannot be satisfied.

TABLE 3

| Sample | Substrate | Coating material/ thickness | Thermal conductivity (W/mK) | Porosity (%) |
|---|---|---|---|---|
| 1 | 96% Al$_2$O$_3$ | None | 30 | 70 |
| 2 | Sapphire | None | 41 | 70 |
| 3 | 96% Al$_2$O$_3$ | Ni—P/50 nm | 29 | 2 |
| 4 | 96% Al$_2$O$_3$ | Ni—P/1 um | 31 | 1 |
| 5 | 96% Al$_2$O$_3$ | Ni—P/2 um | (Separated) | 31 |
| 6 | 96% Al$_2$O$_3$ | Ni—P/4 um | 20 | 67 |
| 7 | 96% Al$_2$O$_3$ | Ni—B/1 um | 27 | 22 |
| 8 | 96% Al$_2$O$_3$ | Ni—B/3 um | 22 | 57 |
| 9 | Sapphire | Ni—P/50 nm | 48 | 9 |
| 10 | Sapphire | Ni—P/250 nm | 39 | 6 |
| 11 | Sapphire | Ni—P/1.5 um | (Separated) | 57 |
| 12 | Sapphire | Ni—P/8 um | 41 | (Difficult to bond) |

Figure 26A:
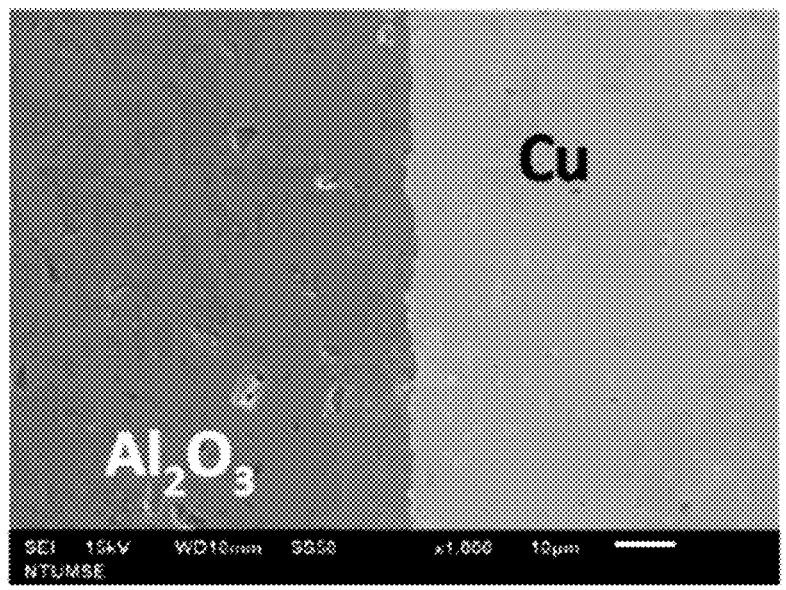
FIGS. 26A to 26E are cross-sectional photomicrographs showing five ceramic/metal composite structures.
Figure 26B:
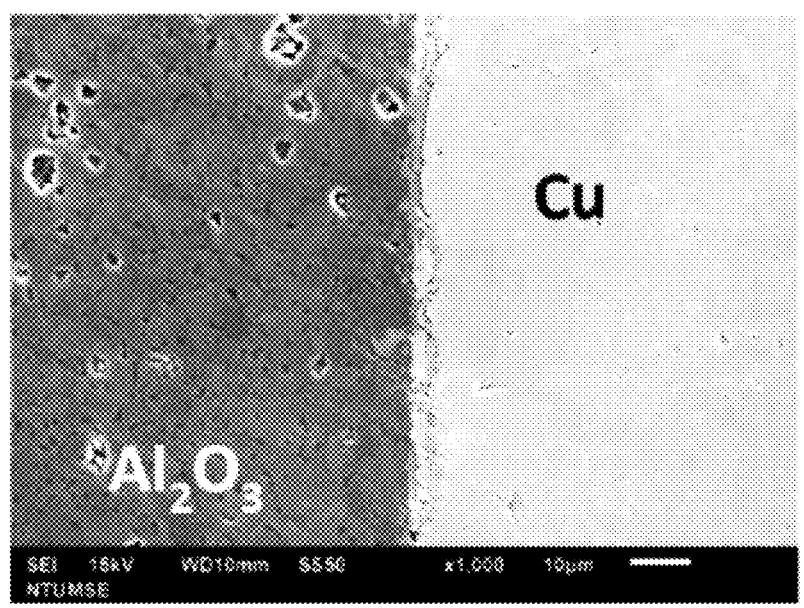
Figure 26C:
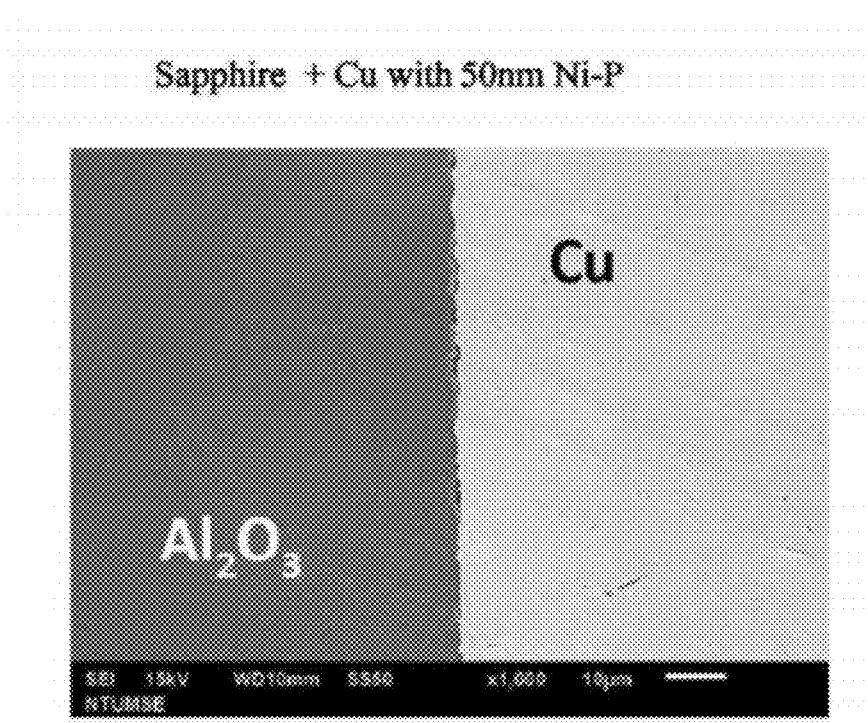
Figure 26D:
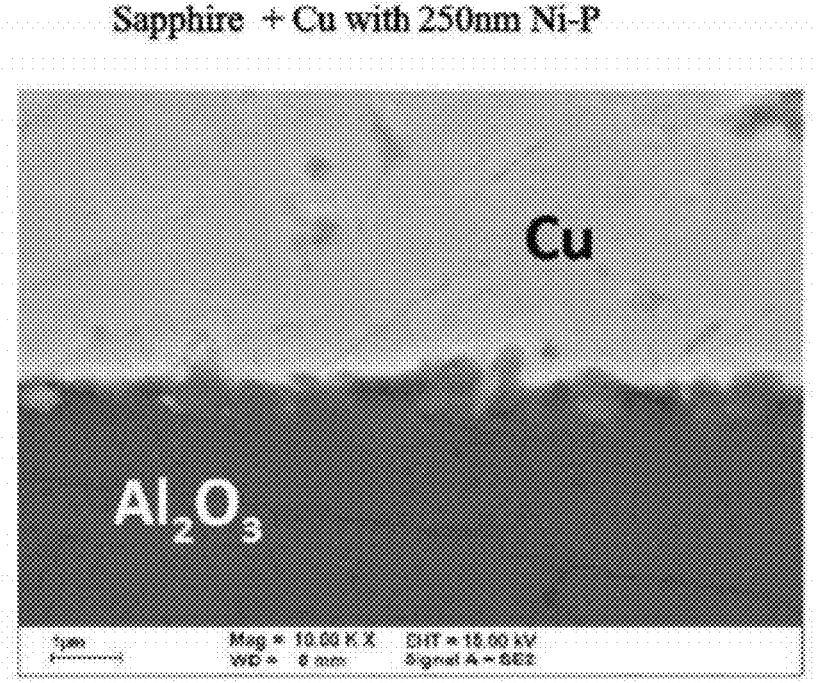
Figure 26E:
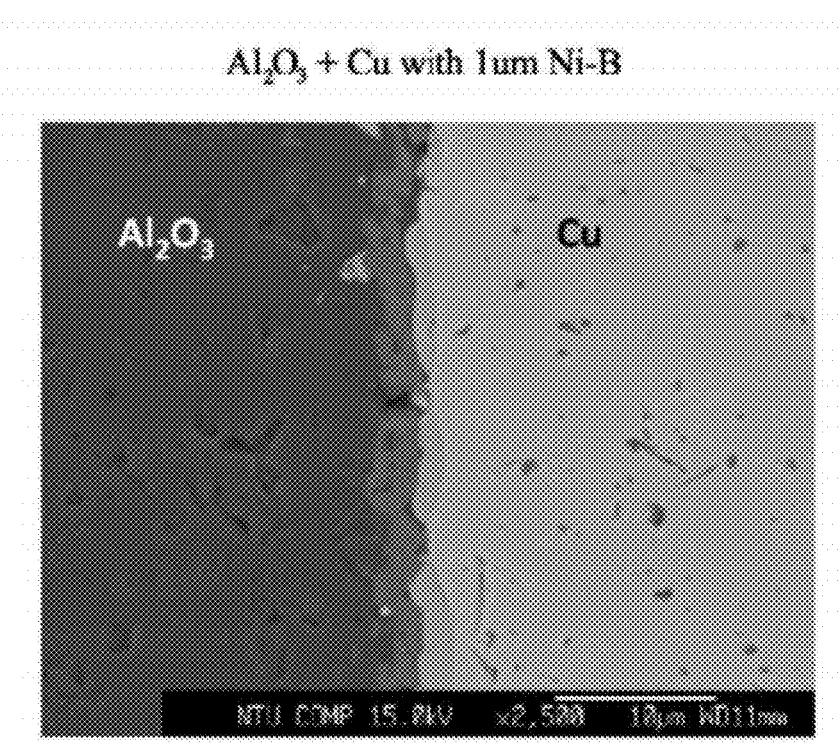
Figure 27A:
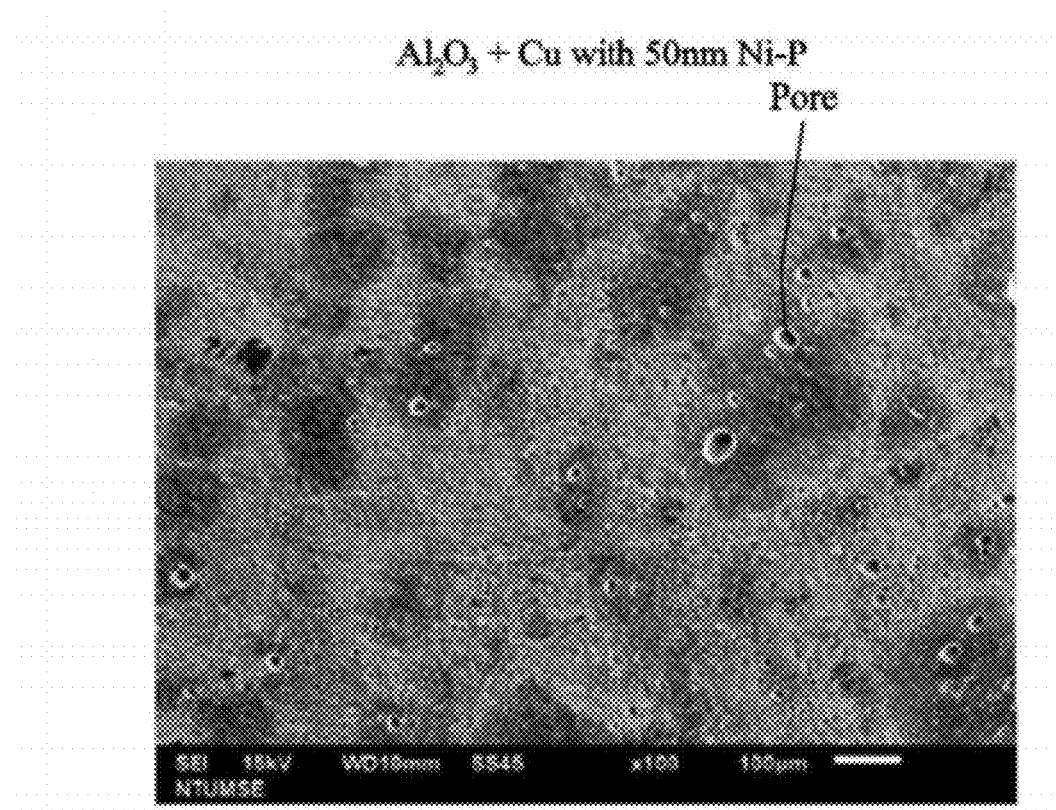
FIGS. 27A to 27E are microphotographs showing the surfaces of the copper sheets observed after copper sheets and aluminum oxide substrates of five ceramic/metal composite structures are peeled off, respectively.
Figure 27B:
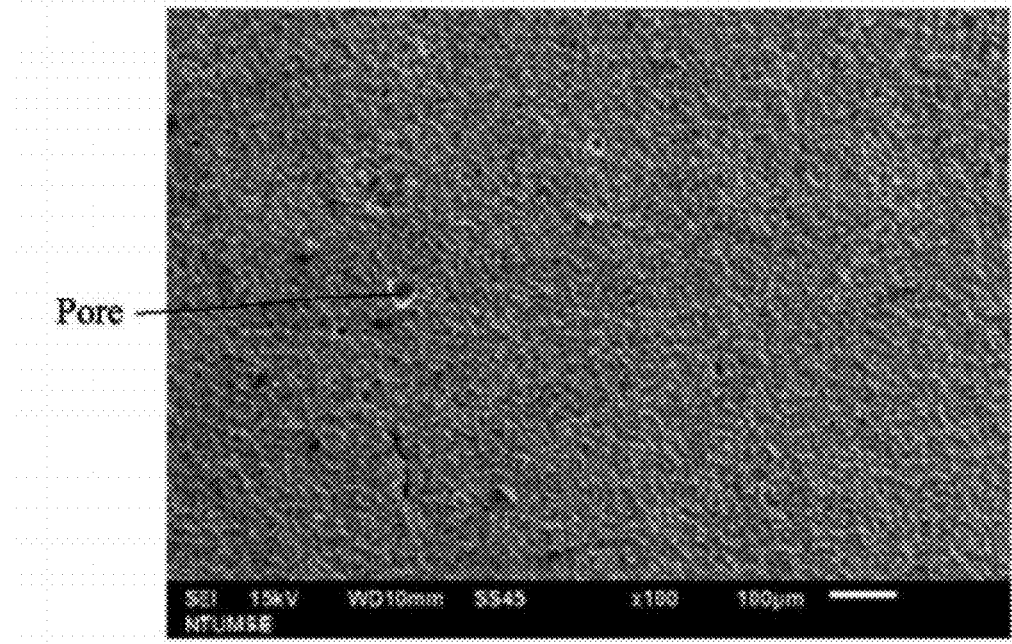
Figure 27C:
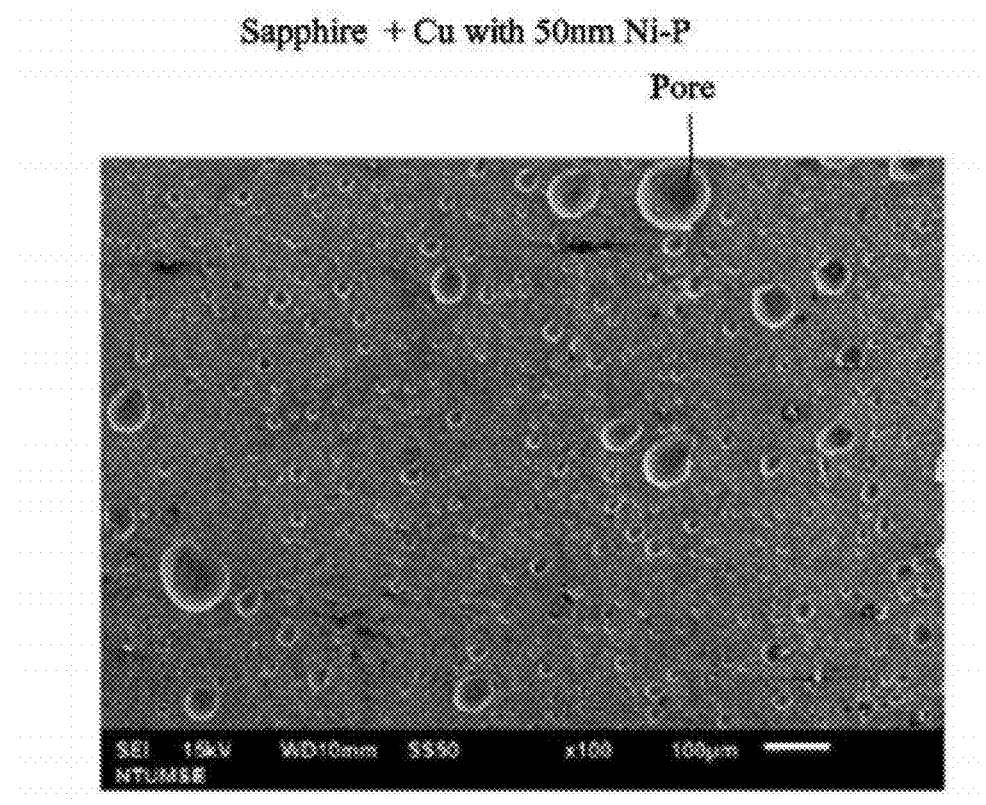
Figure 27D:
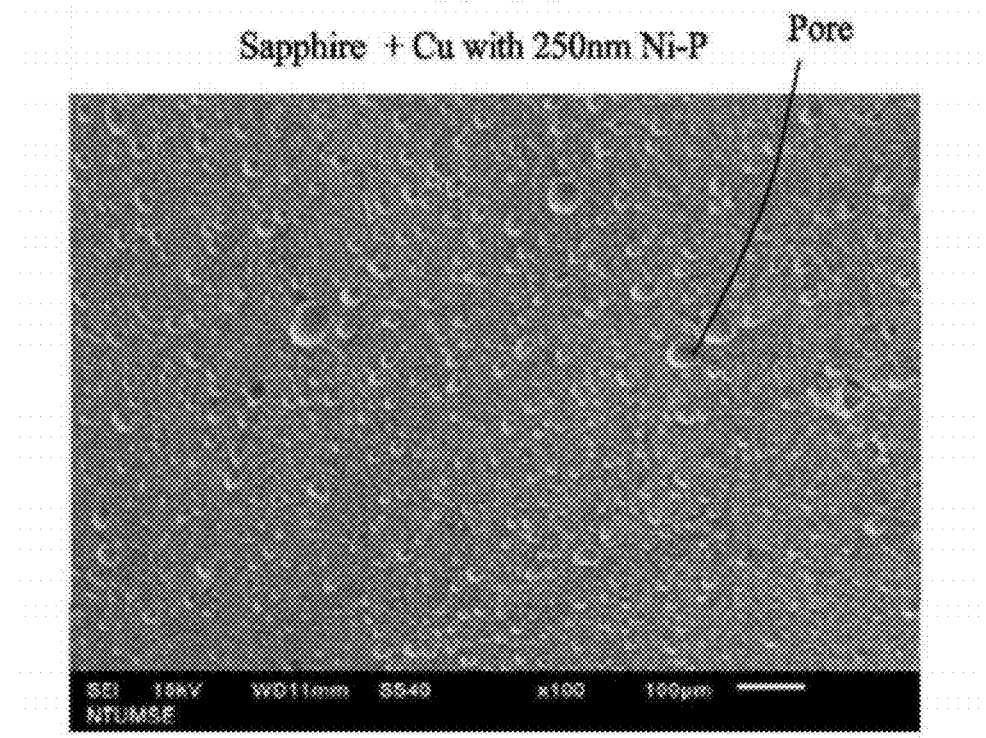
Figure 27E:
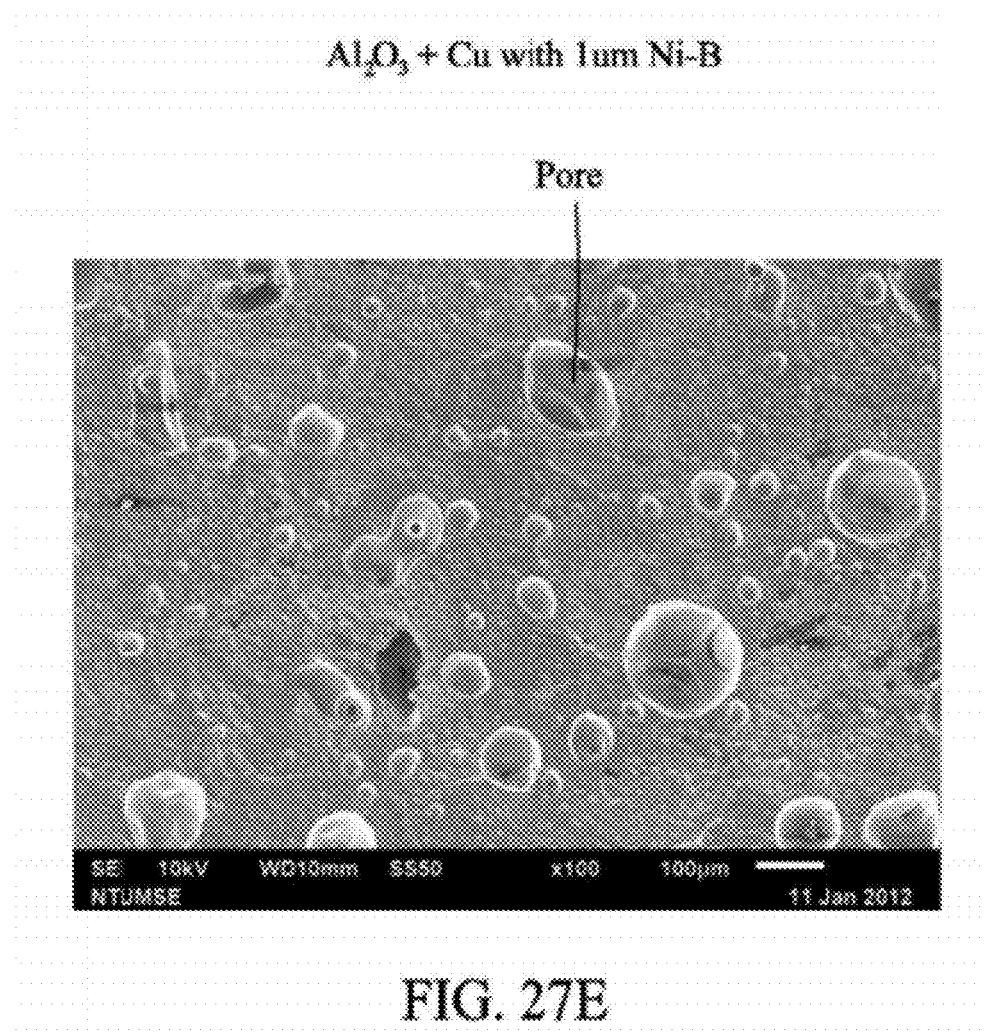

FIGS. 26A to 26E are cross-sectional photomicrographs showing vertical cross-sections of five ceramic/metal composite structures, which satisfy the advanced requirements of the invention. FIGS. 27A to 27E are microphotographs showing the surfaces of the copper sheets observed after copper sheets and aluminum oxide substrates of five ceramic/metal composite structures are peeled off, respectively. FIGS. 26A and 27A correspond to Sample 3, where the thickness of Ni—P is 50 nm, FIGS. 26B and 27B correspond to Sample 4, where the thickness of Ni—P is 50 nm, FIGS. 26C and 27C correspond to Sample 9, FIGS. 26D and 27D correspond to Sample 10, and FIGS. 26E and 27E correspond to Sample 7. As shown in FIGS. 26A to 26D, it is found out that the bonding interface between the copper sheet and the aluminum oxide substrate is very good, and only an extremely small amount of residual Ni layer and nickel aluminum compound layer are remained. This is significantly different from the condition of the eighth embodiment. According to FIGS. 27A to 27D, it is found out that the sizes and distribution of the pores are significantly different from those of the eighth embodiment. As shown in FIG. 26E, it is found out that the bonding interface between the copper sheet and the aluminum oxide substrate is very good, and only an extremely small amount of residual Ni layer and nickel aluminum compound layer are remained. This is significantly different from the condition of the eighth embodiment. According to FIG. 27E, it is found out that the sizes and distribution of the pores are significantly different from those of the eighth embodiment. This represents that the nickel alloy layer is advantageous to the reduction in the number and sizes of the pores, so that the bonded area can be increased. In addition, after comparing the eighth embodiment with the ninth embodiment, it is found out that although the too thick nickel alloy layer can slightly solve the problem of the pores, the bonding strength is decreased so that the copper sheet tends to be separated from the aluminum oxide substrate. This cannot satisfy the advanced requirement of the invention.

Figure 28:
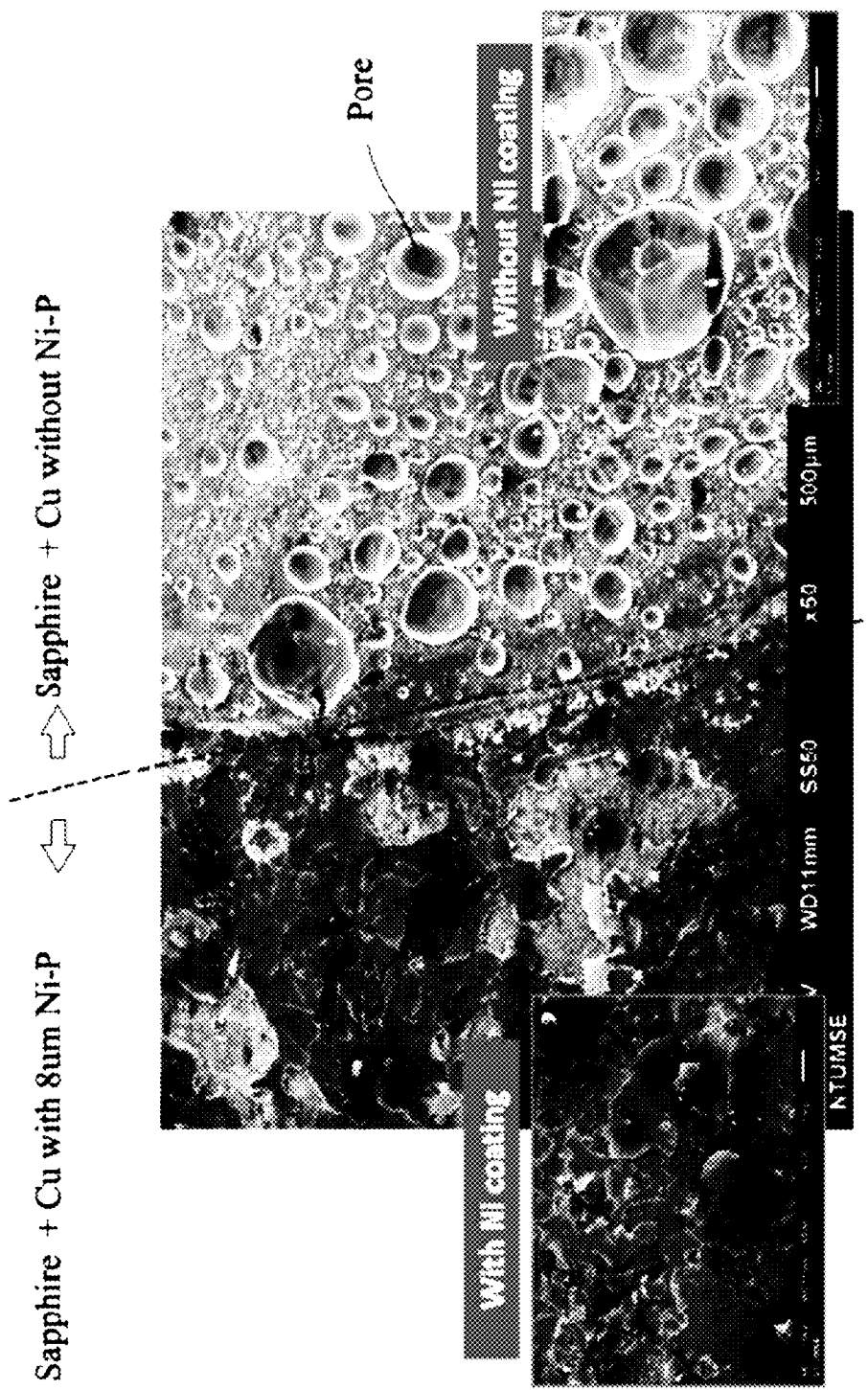
FIG. 28 is a microphotograph of a control group showing a surface of a copper sheet observed after an aluminum oxide substrate and a copper sheet of a ceramic/metal composite structure are peeled off.

In order to point out the poor influence of the too thick coating layer in the same sample, the sapphire substrate coated with a Ni—P layer with the thickness of 8 microns is provided, and a portion of the Ni—P layer is removed from the sapphire substrate by way of tearing, and then the sapphire substrate with a portion of Ni—P layer is bonded with the copper sheet. It is to be noted that the too thin Ni—P layer cannot be partially removed from the sapphire substrate by way of tearing due to the structural strength. The bonded result is shown in FIG. 28, wherein the left half portion corresponds to the bonded structure with the Ni—P coating layer, and the right half portion corresponds to the bonded structure without the Ni—P coating layer, and the two half portions are separated by a dashed line. There are many large pores in the bonded structure without the Ni—P coating layer, while almost no bonding effect is formed in the bonded structure with the Ni—P coating layer due to the too thick Ni—P coating layer (8 µm).

The ninth embodiment of the invention also provides a method of manufacturing a ceramic/metal composite structure. The method includes the following steps. First, as shown in FIG. 25A, an aluminum oxide substrate 210S is provided. Then, a nickel alloy interface layer 230S, having the thickness smaller than or equal to 1000 nanometers, is formed on the aluminum oxide substrate 210S. In this embodiment, the nickel alloy interface layer 230S is formed by way of electroless plating. However, the invention is not particularly restricted thereto. Of course, other suitable methods may also be adopted to form the nickel alloy interface layer 230S on the aluminum oxide substrate 210S, Next, the copper sheet 220S is placed on the nickel alloy interface layer 230S. Then, the aluminum oxide substrate 210S, the nickel alloy interface layer 230S and the copper sheet 220S are heated so that the nickel alloy interface layer 230S forms strong bonds with the aluminum oxide substrate 210S and the copper sheet 220S. The nickel alloy interface layer 230S reacts with the copper sheet 220S to form an interface bonding layer 230, which has many pores 240, as shown in FIG. 25B. The nickel alloy interface layer 230S functions to separate the copper sheet 220S from the aluminum oxide substrate 210S to disable the copper from reacting with the aluminum oxide as much as possible. A sum of the cross-sectional areas of the pores is substantially smaller than or equal to 25% of a cross-sectional area of the interface bonding layer. Similarly, the nickel alloy interface layer 230S provides a wetting effect for the copper sheet 220S to the aluminum oxide substrate 210S at the high temperature.

In the above-mentioned method of this invention, the copper sheet needs not to be softened before the copper sheet is bonded to the aluminum oxide substrate and needs not to be formed with patterns. In addition, the manufacturing processes are simple and do not cost too much because no glass filler is needed to eliminate the bubbles. The prior arts do not discuss the influence of the thickness of the nickel alloy interface layer on the pores, and do not propose a method of enhancing the thermal conductivity and the bonding strength by using the thickness control of the nickel alloy interface layer to decrease the porosity.

While the present invention has been described by way of examples and in terms of preferred embodiments, it is to be understood that the invention is not limited thereto. To the contrary, it is intended to cover various modifications. Therefore, the scope of the appended claims should be accorded the broadest interpretation so as to encompass all such modifications.

What is claimed is:

1. A ceramic/metal composite structure, comprising:
an aluminum oxide substrate;
an interface bonding layer directly disposed on the aluminum oxide substrate; and
a copper sheet directly disposed on the interface bonding layer and entirely separated from the aluminum oxide substrate by the interface bonding layer, wherein the interface bonding layer directly bonds the aluminum oxide substrate to the copper sheet and has a plurality of pores, and a porosity of the interface bonding layer is substantially smaller than or equal to 25% and substantially greater than or equal to 1%.

2. The ceramic/metal composite structure according to claim 1, wherein a material of the aluminum oxide substrate is polycrystalline 96% aluminum oxide.

3. The ceramic/metal composite structure according to claim 1, wherein a material of the aluminum oxide substrate is sapphire.

4. The ceramic/metal composite structure according to claim 1, wherein a material of the interface bonding layer is a copper-nickel-phosphorus alloy.

5. The ceramic/metal composite structure according to claim 1, wherein a material of the interface bonding layer is a copper-nickel-boron alloy.

6. The ceramic/metal composite structure according to claim 1, wherein the porosity of the interface bonding layer is substantially smaller than or equal to 10%.

7. The ceramic/metal composite structure according to claim 1, wherein the porosity of the interface bonding layer is substantially smaller than or equal to 6%.

8. The ceramic/metal composite structure according to claim 1, wherein the interface bonding layer is interposed between the aluminum oxide substrate and the copper sheet.

9. The ceramic/metal composite structure according to claim 1, wherein the aluminum oxide substrate is separated from the copper sheet by the interface bonding layer.

10. The ceramic/metal composite structure according to claim 1, wherein an interface surface between the copper sheet and the interface bonding layer and an interface surface between the interface bonding layer and the aluminum oxide substrate extend in substantially the same direction.

11. The ceramic/metal composite structure according to claim 1, wherein the aluminum oxide substrate, the interface bonding layer and the copper sheet are stacked in order.

12. The ceramic/metal composite structure according to claim 1, wherein the porosity of the interface bonding layer is substantially greater than or equal to 2%.

13. The ceramic/metal composite structure according to claim 1, wherein the porosity of the interface bonding layer is substantially greater than or equal to 6%.

14. The ceramic/metal composite structure according to claim 1, wherein the porosity of the interface bonding layer is substantially greater than or equal to 9%.

* * * * *